(12) United States Patent
Masuoka et al.

(10) Patent No.: US 8,487,357 B2
(45) Date of Patent: Jul. 16, 2013

(54) SOLID STATE IMAGING DEVICE HAVING HIGH SENSITIVITY AND HIGH PIXEL DENSITY

(75) Inventors: Fujio Masuoka, Tokyo (JP); Nozomu Harada, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 214 days.

(21) Appl. No.: 13/046,113

(22) Filed: Mar. 11, 2011

(65) Prior Publication Data

US 2011/0220969 A1  Sep. 15, 2011

Related U.S. Application Data

(60) Provisional application No. 61/313,227, filed on Mar. 12, 2010.

(30) Foreign Application Priority Data

Mar. 12, 2010  (JP) .................................. 2010-056122
Dec. 10, 2010  (JP) .................................. 2010-276309

(51) Int. Cl.
*H01L 31/062* (2012.01)
*H01L 31/113* (2006.01)
(52) U.S. Cl.
USPC .................................. 257/292; 257/E27.133
(58) Field of Classification Search
USPC .......................................... 257/292, E27.151
See application file for complete search history.

(56) References Cited

U.S. PATENT DOCUMENTS

| 5,017,977 | A | 5/1991 | Richardson |
| 5,258,635 | A | 11/1993 | Nitayama et al. |
| 5,308,782 | A | 5/1994 | Mazure et al. |
| 5,312,767 | A | 5/1994 | Shimizu et al. |
| 5,382,816 | A | 1/1995 | Mitsui |

(Continued)

FOREIGN PATENT DOCUMENTS

| CN | 1507035 | 6/2004 |
| CN | 1610126 A | 4/2005 |

(Continued)

OTHER PUBLICATIONS

Notice of Allowance for U.S. Appl. No. 12/894,923, dated Feb. 21, 2013, 5 pages.

(Continued)

*Primary Examiner* — Howard Weiss
(74) *Attorney, Agent, or Firm* — Brinks Hofer Gilson & Lione

(57) ABSTRACT

Each pixel of a solid state imaging device comprises: a first semiconductor layer; a second semiconductor layer; a third semiconductor layer and fourth semiconductor layer formed on the lateral side of the upper region of the second layer not to be in contact with the top surface of the second semiconductor layer; a gate conductor layer formed on the lower side of the second semiconductor layer; a conductor electrode formed on the side of the fourth semiconductor layer via an insulating film; and a fifth semiconductor layer formed on the top surface of the second semiconductor layer, wherein at least the third semiconductor layer, upper region of the second semiconductor layer, fourth semiconductor layer, and fifth semiconductor layer are formed in the shape of an island. A specific voltage is applied to the conductor electrode to accumulate holes in the surface region of the fourth semiconductor layer.

9 Claims, 26 Drawing Sheets

U.S. PATENT DOCUMENTS

| | | |
|---|---|---|
| 5,416,350 A | 5/1995 | Watanabe |
| 5,480,838 A | 1/1996 | Mitsui |
| 5,627,390 A | 5/1997 | Maeda et al. |
| 5,656,842 A | 8/1997 | Iwamatsu et al. |
| 5,703,386 A | 12/1997 | Yasuda et al. |
| 5,707,885 A | 1/1998 | Lim |
| 5,710,447 A | 1/1998 | Tohyama |
| 5,767,549 A | 6/1998 | Chen et al. |
| 5,780,888 A | 7/1998 | Maeda et al. |
| 5,811,336 A | 9/1998 | Kasai |
| 5,872,037 A | 2/1999 | Iwamatsu et al. |
| 5,905,283 A | 5/1999 | Kasai |
| 5,994,735 A | 11/1999 | Maeda et al. |
| 6,121,086 A | 9/2000 | Kuroda et al. |
| 6,127,209 A | 10/2000 | Maeda et al. |
| 6,175,138 B1 | 1/2001 | Noda |
| 6,294,418 B1 | 9/2001 | Noble |
| 6,392,271 B1 | 5/2002 | Alavi et al. |
| 6,406,962 B1 | 6/2002 | Agnello et al. |
| 6,420,751 B1 | 7/2002 | Maeda et al. |
| 6,461,900 B1 | 10/2002 | Sundaresan et al. |
| 6,483,171 B1 | 11/2002 | Forbes et al. |
| 6,624,459 B1 | 9/2003 | Dachtera et al. |
| 6,658,259 B2 | 12/2003 | McIntosh |
| 6,740,937 B1 | 5/2004 | Sushihara |
| 6,747,314 B2 | 6/2004 | Sundaresan et al. |
| 6,815,277 B2 | 11/2004 | Fried et al. |
| 6,849,903 B2 | 2/2005 | Sushihara |
| 6,861,684 B2 | 3/2005 | Skotnicki et al. |
| 6,878,991 B1 | 4/2005 | Forbes |
| 6,943,407 B2 | 9/2005 | Ouyang et al. |
| 7,052,941 B2 | 5/2006 | Lee |
| 7,193,278 B2 | 3/2007 | Song |
| 7,198,976 B2 | 4/2007 | Hirata |
| 7,233,033 B2 | 6/2007 | Koyama et al. |
| 7,241,655 B2 | 7/2007 | Tang et al. |
| 7,271,052 B1 | 9/2007 | Forbes |
| 7,368,334 B2 | 5/2008 | Yeo et al. |
| 7,374,990 B2 | 5/2008 | Tang et al. |
| 7,413,480 B2 | 8/2008 | Thomas |
| 7,579,214 B2 | 8/2009 | Yamazaki et al. |
| 7,619,675 B2 * | 11/2009 | Horii ............................ 348/311 |
| 7,829,952 B2 | 11/2010 | Moniwa et al. |
| 7,872,287 B2 | 1/2011 | Masuoka et al. |
| 7,977,736 B2 | 7/2011 | Kim et al. |
| 7,977,738 B2 | 7/2011 | Minami et al. |
| 7,981,738 B2 | 7/2011 | Moniwa et al. |
| 8,039,893 B2 | 10/2011 | Masuoka et al. |
| 8,058,683 B2 | 11/2011 | Yoon et al. |
| 8,067,800 B2 | 11/2011 | Hsieh |
| 8,110,869 B2 | 2/2012 | Bhalla |
| 8,188,537 B2 | 5/2012 | Masuoka et al. |
| 8,227,305 B2 | 7/2012 | Forbes |
| 8,378,400 B2 * | 2/2013 | Masuoka et al. ............ 257/292 |
| 2001/0052614 A1 | 12/2001 | Ishibashi |
| 2002/0000624 A1 | 1/2002 | Takemura et al. |
| 2002/0034853 A1 | 3/2002 | Alavi et al. |
| 2002/0110039 A1 | 8/2002 | Forbes et al. |
| 2002/0195652 A1 | 12/2002 | Maeda et al. |
| 2003/0002093 A1 | 1/2003 | Hynecek |
| 2003/0075758 A1 | 4/2003 | Sundaresan et al. |
| 2004/0005755 A1 | 1/2004 | Moniwa et al. |
| 2004/0113207 A1 | 6/2004 | Hsu et al. |
| 2004/0135215 A1 | 7/2004 | Song |
| 2004/0169293 A1 | 9/2004 | Sushihara |
| 2004/0256639 A1 | 12/2004 | Ouyang et al. |
| 2004/0262681 A1 | 12/2004 | Masuoka et al. |
| 2005/0127404 A1 | 6/2005 | Sushihara |
| 2005/0145911 A1 | 7/2005 | Forbes et al. |
| 2005/0263821 A1 | 12/2005 | Cho et al. |
| 2005/0281119 A1 | 12/2005 | Shibata et al. |
| 2006/0006444 A1 | 1/2006 | Leslie |
| 2006/0007333 A1 | 1/2006 | Horii |
| 2006/0033524 A1 | 2/2006 | Sushihara |
| 2006/0043520 A1 | 3/2006 | Jerdev et al. |
| 2006/0046391 A1 | 3/2006 | Tang et al. |
| 2006/0261406 A1 | 11/2006 | Chen |
| 2007/0007601 A1 | 1/2007 | Hsu et al. |
| 2007/0075359 A1 | 4/2007 | Yoon et al. |
| 2007/0117324 A1 | 5/2007 | Previtali |
| 2007/0138557 A1 | 6/2007 | Ipposhi |
| 2007/0173006 A1 | 7/2007 | Moniwa et al. |
| 2008/0048245 A1 | 2/2008 | Kito et al. |
| 2008/0173936 A1 | 7/2008 | Yoon et al. |
| 2008/0210985 A1 | 9/2008 | Ogawa et al. |
| 2008/0227241 A1 | 9/2008 | Nakabayashi et al. |
| 2009/0032955 A1 | 2/2009 | Tanaka et al. |
| 2009/0057722 A1 | 3/2009 | Masuoka et al. |
| 2009/0065832 A1 | 3/2009 | Masuoka et al. |
| 2009/0114989 A1 | 5/2009 | Hamamoto |
| 2009/0159964 A1 | 6/2009 | Lee |
| 2009/0174024 A1 | 7/2009 | Kim |
| 2009/0197379 A1 | 8/2009 | Leslie |
| 2009/0290082 A1 | 11/2009 | Yamazaki et al. |
| 2009/0291551 A1 | 11/2009 | Cho |
| 2010/0052029 A1 | 3/2010 | Huang |
| 2010/0200731 A1 | 8/2010 | Masuoka et al. |
| 2010/0200913 A1 | 8/2010 | Masuoka et al. |
| 2010/0207172 A1 | 8/2010 | Masuoka et al. |
| 2010/0207201 A1 | 8/2010 | Masuoka et al. |
| 2010/0207213 A1 | 8/2010 | Tan et al. |
| 2010/0213525 A1 | 8/2010 | Masuoka et al. |
| 2010/0213539 A1 | 8/2010 | Masuoka et al. |
| 2010/0219457 A1 | 9/2010 | Masuoka et al. |
| 2010/0219483 A1 | 9/2010 | Masuoka et al. |
| 2010/0270611 A1 | 10/2010 | Masuoka et al. |
| 2010/0276750 A1 | 11/2010 | Tu |
| 2010/0295123 A1 | 11/2010 | Lung et al. |
| 2011/0073925 A1 | 3/2011 | Park et al. |
| 2011/0215381 A1 * | 9/2011 | Masuoka et al. ............ 257/229 |
| 2011/0254067 A1 | 10/2011 | Abbott et al. |
| 2011/0275207 A1 | 11/2011 | Moniwa et al. |
| 2011/0303973 A1 | 12/2011 | Masuoka et al. |
| 2011/0303985 A1 | 12/2011 | Masuoka et al. |
| 2012/0086051 A1 | 4/2012 | Wang et al. |
| 2012/0196415 A1 | 8/2012 | Masuoka et al. |

FOREIGN PATENT DOCUMENTS

| | | |
|---|---|---|
| CN | 1983601 A | 6/2007 |
| CN | 101542733 A | 9/2009 |
| DE | 4443968 | 11/1995 |
| EP | 1770769 A1 | 4/2007 |
| EP | 2197032 A1 | 6/2010 |
| EP | 2239770 A1 | 10/2010 |
| EP | 2239771 A1 | 10/2010 |
| EP | 2244305 A1 | 10/2010 |
| EP | 2246895 A1 | 11/2010 |
| JP | 60-070757 A | 4/1985 |
| JP | 61-013661 | 1/1986 |
| JP | 62-045058 A | 2/1987 |
| JP | 62-190751 | 8/1987 |
| JP | 63-037633 A | 2/1988 |
| JP | 63-158866 A | 7/1988 |
| JP | 64-089560 A | 4/1989 |
| JP | 01-175775 A | 7/1989 |
| JP | 02-066969 A | 3/1990 |
| JP | 02-071556 | 3/1990 |
| JP | 02-089368 A | 3/1990 |
| JP | 02-188966 | 7/1990 |
| JP | 03-114233 | 5/1991 |
| JP | 03-145761 | 6/1991 |
| JP | 03-225873 A | 10/1991 |
| JP | 04-234166 A | 8/1992 |
| JP | 05-276442 A | 10/1993 |
| JP | 06-021467 A | 1/1994 |
| JP | 06-069441 | 3/1994 |
| JP | 06-237003 A | 8/1994 |
| JP | 07-099311 | 4/1995 |
| JP | 07-321228 | 12/1995 |
| JP | 08-078533 A | 3/1996 |
| JP | 09-008295 | 1/1997 |
| JP | 10-079482 A | 3/1998 |
| JP | 10-223777 A | 8/1998 |
| JP | 11-087649 | 3/1999 |
| JP | 2000-012705 A | 1/2000 |
| JP | 2000-068516 | 3/2000 |
| JP | 2000-208434 | 7/2000 |

| | | | |
|---|---|---|---|
| JP | 2000-243085 | | 9/2000 |
| JP | 2000-244818 | A | 9/2000 |
| JP | 2000-357736 | | 12/2000 |
| JP | 2001-028399 | | 1/2001 |
| JP | 2001-237421 | A | 8/2001 |
| JP | 2001-339057 | A | 12/2001 |
| JP | 2001-352047 | A | 12/2001 |
| JP | 2002-009257 | | 1/2002 |
| JP | 2002-033399 | A | 1/2002 |
| JP | 2002-231951 | A | 8/2002 |
| JP | 2002-246580 | A | 8/2002 |
| JP | 2002-246581 | A | 8/2002 |
| JP | 2003-068883 | A | 3/2003 |
| JP | 2003-142684 | | 5/2003 |
| JP | 2003-179160 | A | 6/2003 |
| JP | 2003-224211 | A | 8/2003 |
| JP | 2004-079694 | | 3/2004 |
| JP | 2004-096065 | A | 3/2004 |
| JP | 2004-153246 | | 5/2004 |
| JP | 2004-193588 | A | 7/2004 |
| JP | 2004-259733 | A | 9/2004 |
| JP | 2004-319808 | A | 11/2004 |
| JP | 2005-012213 | A | 1/2005 |
| JP | 2005-135451 | | 5/2005 |
| JP | 2006-024799 | A | 1/2006 |
| JP | 2006-514392 | | 4/2006 |
| JP | 2006-294995 | A | 10/2006 |
| JP | 2007-0250652 | A | 9/2007 |
| JP | 2008-177565 | | 7/2008 |
| JP | 2008-205168 | A | 9/2008 |
| JP | 2008-300558 | A | 12/2008 |
| JP | 2009-110049 | A | 5/2009 |
| JP | 2009-182316 | A | 8/2009 |
| JP | 2009-182317 | A | 8/2009 |
| JP | 2010-171055 | | 8/2010 |
| JP | 2010-0213539 | A | 9/2010 |
| JP | 2010-258345 | | 11/2010 |
| JP | 2011-066105 | | 3/2011 |
| JP | 2011-071235 | | 4/2011 |
| JP | 2011-077437 | | 4/2011 |
| JP | 2011-211161 | A | 10/2011 |
| KR | 10-0132560 | | 12/1997 |
| KR | 10-0200222 | | 6/1999 |
| KR | 10-0327875 | B1 | 9/2002 |
| KR | 2004-0063348 | A | 7/2004 |
| WO | WO 94/14198 | A1 | 6/1994 |
| WO | WO 01/22494 | A1 | 3/2001 |
| WO | WO 2005/036651 | | 4/2005 |
| WO | WO 2006/127586 | | 11/2006 |
| WO | WO 2009/034623 | A1 | 3/2009 |
| WO | WO 2009/034731 | A1 | 3/2009 |
| WO | WO 2009/057194 | A1 | 5/2009 |
| WO | WO 2009/095997 | A1 | 8/2009 |
| WO | WO 2009/096001 | A1 | 8/2009 |
| WO | WO 2009/096464 | A1 | 8/2009 |
| WO | WO 2009/096465 | A1 | 8/2009 |
| WO | WO 2009/096466 | A1 | 8/2009 |
| WO | WO 2009/096470 | A1 | 8/2009 |
| WO | WO 2009/102059 | A1 | 8/2009 |
| WO | WO 2009/133957 | A1 | 11/2009 |
| WO | WO 2011/111662 | A1 | 9/2011 |

OTHER PUBLICATIONS

Notice of Allowance for U.S. Appl. No. 12/894,923, dated Mar. 14, 2013, 5 pages.
Restriction Requirement for U.S. Appl. No. 13/116,506, dated Feb. 28, 2013, 6 pages.
Office Action for U.S. Appl. No. 13/412,959, dated Mar. 13, 2013, 7 pages.
Office Action for Korean Patent Application Serial No. 9-5-2013-010869116, dated Feb. 18, 2013, 4 pages.
International Search Report for PCT/JP2011/079300, dated Mar. 13, 2012, 5 pages.
Lee, et al., "An Active Pixel Sensor Fabricated Using CMOS/CCD Process Technology" in Program IEEE Workshop on Charge-Coupled Devices and Advanced Image Sensors, 1995, 5 pages.
Murakami et al., "Technologies to Improve Photo-Sensitivity and Reduce VOD Shutter Voltage for CCD Image Sensors", IEEE Transactions on Electron Devices, vol. 47, No. 8, 2000, pp. 1566-1572.
Takahashi et al., "A 3.9-µm Pixel Pitch VGA Format 10-b Digital Output CMOS Image Sensor With 1.5 Transistor/Pixel", IEEE Journal of Solid-State Circuit, Vo.39, No. 12, 2004, pp. 2417-2425.
Yasutomi et al, "A High-Speed CMOS Image Sensor with Global Electronic Shutter Pixel Using Pinned Diodes", IEEJ Trans. SM, vol. 129, No. 10, 2009, pp. 321-327.
Guidash, R.M. et al., "A 0.6 µm CMOS Pinned Photodiode Color Imager Technology," IEDM Digest Papers, pp. 927-929, 1997.
Mendis, Sunetra K., "A 128 x 128 CMOS Active Pixel Image Sensor for Highly Integrated Imaging System," IEDM93, Digest Papers, 22.6.1, pp. 583-586, 1993.
Agranov, G. et al., "Pixel Size Reduction of CMOS Image Sensors and Comparison of Characteristics", *The Institute of Image Formation and Television Engineers (ITE) Technical Report*, vol. 33, No. 38, pp. 9-12, Sep. 2009.
Chen, Yijian et al., "Vertical integrated-gate CMOS for ultra-dense IC", *Microelectronic Engineering*, vol. 83, 2006, pp. 1745-1748.
Choi, Yang-Kyu et al., "FinFET Process Refinements for Improved Mobility and Gate Work Function Engineering," IEEE, 2002, 4 pages.
Office Action for Chinese Patent Application Serial No. 200980103454.9, dated Oct. 31, 2012, 7 pages.
Office Action for Chinese Patent Application Serial No. 200980103505.8, dated Nov. 1, 2012, 5 pages.
Office Action for Chinese Patent Application Serial No. 201010171435.4, dated Dec. 21, 2012, 7 pages.
Office Action for Japanese Patent Application Serial No. 2009-538870, dated Nov. 8, 2012, 4 pages.
Restriction Requirement for U.S. Appl. No. 13/412,959, dated Nov. 8, 2012, 6 pages.
European Search Report for counterpart European Application No. 09705485.2, dated Feb. 14, 2011, 5 pages.
Examination Report for European Application No. 08722595.9, dated Jul. 11, 2012, 4 pages.
Examination Report in corresponding European Application No. 07 807 139.6, dated Jun. 11, 2012, 4 pages.
Extended European Search Report for European Application No. 07807139.6, dated Jun. 24, 2011, 10 pages.
Extended European Search Report for European Application No. 10004492.4, dated Jun. 21, 2012, 10 pages.
Extended European Search Report for European Application No. 10009574.4, dated May 15, 2012, 6 pages.
Extended European Search Report for European Application No. 12001395.8, dated Apr. 26, 2012, 7 pages.
Extened European Search Report for European Application No. 10009579.3, dated Jun. 11, 2012, 11 pages.
Hieda, K. et al., "New Effects of Trench Isolated Transistor Using Side-Wall Gates", *VLSI Research Center*, Toshiba Corporation, 1987, 4 pages.
International Preliminary Report on Patentability for International Application No. PCT/JP2008/051300, dated Aug. 31, 2010, 9 pages.
International Preliminary Report on Patentability for International Application No. PCT/JP2009/051459, dated Aug. 31, 2010, 9 pages.
International Preliminary Report on Patentability for International Application No. PCT/JP2011/055264, dated Oct. 11, 2012, 7 pages.
International Search Report for International Application No. PCT/JP2007/067732, dated Dec. 11, 2007, 2 pages.
International Search Report for International Application No. PCT/JP2007/071052, dated Jan. 29, 2008, 6 pages.
International Search Report for International Application No. PCT/JP2008/051300, dated May 13, 2008, 4 pages.
International Search Report for International Application No. PCT/JP2008/051301, dated Apr. 1, 2008, 2 pages.
International Search Report for International Application No. PCT/JP2008/051302, dated Apr. 8, 2008, 2 pages.
International Search Report for International Application No. PCT/JP2008/051304, dated Apr. 15, 2008, 2 pages.
International Search Report for International Application No. PCT/JP2008/058412, dated Jun. 10, 2008, 2 pages.
International Search Report for International Application No. PCT/JP2009/051459, dated Apr. 14, 2009, 4 pages.

International Search Report for International Application No. PCT/JP2009/051460, dated Apr. 21, 2009, 2 pages.
International Search Report for International Application No. PCT/JP2009/051461, dated Apr. 21, 2009, 2 pages.
International Search Report for International Application No. PCT/JP2009/051463, dated Feb. 24, 2009, 2 pages.
International Search Report for International Application No. PCT/JP2009/058629, dated Jun. 2, 2009, 2 pages.
International Search Report for International Application No. PCT/JP2011/070534, dated Dec. 6, 2011, 10 pages.
International Search Report for International Application No. PCT/JP2011/071162, dated Dec. 13, 2011, 18 pages.
Iwai, Makoto et al., "High-Performance Buried Gate Surrounding Gate Transistor for Future Three-Dimensional Devices", *Japanese Journal of Applied Physics*, 2004, vol. 43, No. 10, pp. 6904-6906.
Kasano, Masahiro, "A 2.0.mu.m Pixel Pitch MOS Image Sensor with an Amorphous Si Film Color Filter," IEEE International Solid-State Circuits Conference, Feb. 8, 2005, 3 pages.
Maeda, Shigenobu et al., "Impact of a Vertical .PHI.-Shape Transistor (V.PHI.T) Cell for 1 Gbit DRAM and Beyond," IEEE Transactions on Electron Devices, vol. 42, No. 12, Dec. 1995, pp. 2117-2124.
Mistry et al., "A 45nm Logic Technology with High-k+Metal Gate Transistors, Strained Silicon, 9 Cu Interconnect Layers, 193nm Dry Patterning, and 100% Pb-free Packaging", IEEE, pp. 247-250, 2007.
Nakamura, Jun-ichi et al., "Nondestructive Readout Mode Static Induction Transistor (SIT) Photo Sensors," IEEE Transactions on Electron Devices, 1993, vol. 40, pp. 334-341.
Nitayama, Akihiro et al., "Multi-Pillar Surrounding Gate Transistor (M-SGT) for Compact and High-Speed Circuits", *IEEE Transactions on Electron Devices*, vol. 3, No. 3, Mar. 1991, pp. 679-583.
Non-Certified Partial Translation of Office Action from counterpart Korean Application No. 10-2010-7018204, dated Mar. 29, 2012, 1 page.
Notice of Allowance for U.S. Appl. No. 12/704,955, dated Mar. 15, 2012, 8 pages.
Notice of Allowance for U.S. Appl. No. 13/447,721, dated Nov. 2, 2012, 9 pages.
Notice of Allowance for U.S. Appl. No. 12/700,294, dated Oct. 5, 2012, 7 pages.
Office Action from co-pending U.S. Appl. No. 12/704,935, dated Nov. 18, 2011, 9 pages.
Office Action from co-pending U.S. Appl. No. 12/894,923, dated Oct. 2, 2012, 21 pages.
Office Action from co-pending U.S. Appl. No. 13/043,081, dated Jul. 16, 2012, 6 pages.
Office Action from co-pending U.S. Appl. No. 13/113,482, dated Jan. 2, 2013, 9 pages.
Office Action from co-pending U.S. Appl. No. 13/412,959, dated Dec. 7, 2012, 9 pages.
Office Action from co-pending U.S. Appl. No. 12/704,955, dated Dec. 8, 2011, 12 pages.
Office Action from counterpart Korean Application No. 10-2010-7018204, dated Mar. 29, 2012, 7 pages.
Takahashi, Hidekazu, "A 3.9.mu.m Pixel Pitch VGA Format 10b Digital Image Sensor with 1.5-Transistor/Pixel," IEEE International Solid-State Circuits Conference, Feb. 16, 2004, 10 pages.
Takato, Hiroshi et al., "Impact of Surrounding Gate Transistor (SGT) for Ultra-High-Density LSI's," IEEE Transactions on Electron Devices, vol. 38, No. 3, Mar. 1991, pp. 573-578.
Watanabe, S. et al., "A Novel Circuit Technology with Surrounding Gate Transistors (SGT's) for Ultra High Density DRAM's", IEEE Journal of Solid-State Circuits, vol. 30, No. 9, Sep. 1995, pp. 960-971.
Written Opinion of the International Searching Authority for International Application No. PCT/JP2007/067732, dated Dec. 11, 2007, 4 pages.
Written Opinion of the International Searching Authority for International Application No. PCT/JP2007/071052, dated Jan. 29, 2008, 9 pages.
Written Opinion of the International Searching Authority for International Application No. PCT/JP2008/051300, dated Aug. 30, 2010, 8 pages.
Written Opinion of the International Searching Authority for International Application No. PCT/JP2008/051301, dated Apr. 1, 2008, 5 pages.
Written Opinion of the International Searching Authority for International Application No. PCT/JP2008/051302, dated Apr. 8, 2008, 5 pages.
Written Opinion of the International Searching Authority for International Application No. PCT/JP2008/058412, dated Jun. 10, 2008, 4 pages.
Written Opinion of the International Searching Authority for International Application No. PCT/JP2009/051459, dated Aug. 30, 2010, 8 pages.
Written Opinion of the International Searching Authority for International Application No. PCT/JP2009/051460, dated Apr. 21, 2009, 5 pages.
Written Opinion of the International Searching Authority for International Application No. PCT/JP2009/051461, dated Apr. 21, 2009, 6 pages.
Written Opinion of the International Searching Authority for International Application No. PCT/JP2009/058629, dated Jun. 2, 2009, 4 pages.
Wu et al., "High Performance 22/20nm FinFET CMOS Devices with Advanced High-K/Metal Gate Scheme", IEEE, pp. 27.1.1-27.1.4, 2010.
Wuu, S.G. et al., "A Leading-Edge 0.9 µm Pixel CMOS Image Sensor Technology with Backside Illumination: Future Challenges for Pixel Scaling", *IEDM2010 Digest Papers*, 14.1.1, pp. 332-335, 2010.
Yonemoto, Kazuya, "A CMOS Image Sensor with a Simple FPN-Reduction Technology and a Hole Accumulated Diode," 2000 IEEE International Solid-State Circuites Conference, 9 pages.
Notice of Allowance for U.S. Appl. No. 13/043,081, dated Mar. 18, 2013, 6 pages.
Notice of Allowance for U.S. Appl. No. 13/113,482, dated Apr. 4, 2013, 10 pages.
Notice of Allowance for U.S. Appl. No. 12/768,290, dated Apr. 18, 2013, 9 pages.

* cited by examiner

PRIOR ART

US 8,487,357 B2

SOLID STATE IMAGING DEVICE HAVING HIGH SENSITIVITY AND HIGH PIXEL DENSITY

RELATED APPLICATIONS

Pursuant to 35 U.S.C. §119(e), this application claims the benefit of the filing date of Provisional U.S. Patent Application Ser. No. 61/313,227 filed on Mar. 12, 2010. This application also claims priority under 35 U.S.C. §119(a) to JP2010-056122 filed on Mar. 12, 2010 and JP2010-276309 filed on Dec. 10, 2010. The entire contents of these applications are hereby incorporated by reference.

BACKGROUND OF THE INVENTION

1. Field of the Invention

The present invention relates to a solid state imaging device and particularly to a solid state imaging device that achieves reduced mixed color, residual images, dark current, and noise, high sensitivity, and high pixel density.

2. Description of the Related Art

Currently, CCD and CMOS solid state imaging devices are extensively used in video cameras and still cameras. Improvement in the performance of solid state imaging devices, such as higher resolutions and higher sensitivity, is always required. Technical innovations for higher pixel densities have been made to realize higher resolution solid state imaging devices. Furthermore, technical innovations for improved light collection efficiency and reduced noise, dark current, and residual images have been made to realize highly sensitive solid state imaging devices.

The operation of a related art solid state imaging device is described hereafter (for example, see Sunetra K. Mendis, Sabrina E. Kemeny and Eric R. Fossum: "A 128×128 CMOS Active Pixel Image Sensor for Highly Integrated Imaging Systems," IEDM93, Digest Papers, 22.6.1. pp. 583-586 (1993)). FIG. 18A shows the pixel structure of the above CMOS solid state imaging device and FIG. 18B shows the potential profile along the line A-A' in FIG. 18A when signal charge 50 is accumulated. In FIG. 18B, accumulated charge is shown by hatching for distinction. The pixel comprises a signal charge accumulation area consisting of a P-type semiconductor substrate 53 for accumulating signal charges 50 generated by emitted light 52, a silicon oxide film ($SiO_2$ film) 54a, and a photogate PG conductor layer, a transfer gate TG joined to the signal charge accumulation area, a floating diode FD joined to a channel 55 below an electrode of the transfer gate TG, an amplifying MOS transistor 56 having a gate AG connected to the floating diode FD, a selection gate (SG) MOS transistor 57 joined to the amplifying MOS transistor 56, and a reset MOS transistor 58 having a reset gate RG provided on a $SiO_2$ film 54b connected to the floating diode FD and a rest drain RD diode. The reset drain RD of the reset MOS transistor 58 and the drain of the amplifying MOS transistor 56 are connected to a power supply line of a voltage $V_{dd}$. The source of the selection gate (SG) MOS transistor 57 is connected to a signal line 59.

Emitted light (irradiation light) 52 enters the P-type semiconductor substrate 53 through the photogate PG. Then, generated signal charges 50 (electrons in this case) are accumulated in a potential well 51 formed in the surface region of the P-type semiconductor substrate 53 by applying a suitable voltage to the photogate PG. The accumulated signal charges 50 are transferred to the floating diode FD when an ON voltage is applied to the transfer gate TG electrode. Then, the potential of the floating diode FD changes according to the quantity of signal charges 50. At the same time, the gate voltage of the amplifying MOS transistor 56 joined to the floating diode FD changes according to the quantity of signal charges 50. When an ON voltage is applied to the selection gate SG of the selection gate (SG) MOS transistor 57, a signal current according to the gate AG voltage of the amplifying MOS transistor 56 runs through the signal line 59. This current is read as output.

Another solid state imaging device utilizes a photodiode structure in which signal charges are accumulated in a photodiode PD unlike the signal charge accumulation structure using a photogate PG as shown in FIGS. 18A and 18B (for example, see the specification of Unexamined Japanese Patent Application KOKAI Publication No. 2000-244818 and R. M. Guidash, T. H. Lee, P. P. K. Lee, D. H. Sackett, C. I. Drowley, M. S. Swenson, L. Arbaugh, R. Hollstein, F. Shapiro, and S. Domer: "A 0.6 um CMOS Pinned Photodiode Color Imager Technology," IEDM Digest Papers, pp. 927-929 (1997)). Such photodiode structures include a structure (pinned photodiode) having a $P^+$ layer provided on the surface of a photodiode PD and a channel stopper $P^+$ layer connected to the $P^+$ layer and fixed (pinned) to the ground potential for electrically separating pixels from each other.

In the related art CMOS solid state imaging device shown in FIG. 18A, light 52 enters the photogate PG conductor layer from above. The photogate PG conductor layer is, for example, a thin, impurity-doped polysilicon (polycrystalline Si) layer. In such a structure, blue-wavelength light in the incident light 52 is inevitably partly absorbed by the polycrystalline Si layer. Furthermore, since the photogate PG covers the signal charge accumulation area in the surface region of the P-type semiconductor substrate 53, the signal charge accumulation area cannot directly be connected to the gate AG of the amplifying MOS transistor 56. For this reason, the transfer gate TG electrode and floating diode FD are provided. The signal charges 50 accumulated in the potential well 51 of the signal accumulation area are once transferred to the floating diode FD and the potential of the floating diode FD is given to the gate AG of the amplifying MOS transistor 56. Therefore, the transfer gate TG electrode and floating diode FD are necessary in the pixel region. Such additional regions hamper increase in the pixel density in related art CMOS solid state imaging devices.

On the other hand, for example, the solid state imaging device having a pinned photodiode structure described in the specification of Unexamined Japanese Patent Application KOKAI Publication No. 2000-244818 does not have the aforementioned problem of deterioration in sensitivity to blue-wavelength light in the photogate PG structure. With the surface of the photodiode PD being fixed to the ground potential, residual images resulting from incomplete transfer of signal charges to the floating diode FD and noise called kTC noise can be prevented. Furthermore, holes are accumulated in the $P^+$ layer at the surface of the photodiode PD. The holes are recombined with electrons thermally excited from the $SiO_2$—Si interface states and thereby the electrons are prevented from being injected into the signal charges 50. Then, dark current can be reduced. However, as in the aforementioned photogate PG structure, since the surface of the photodiode PD in which signal charges are accumulated is covered with the $P^+$ layer, the potential of the photodiode in which signal charges are accumulated cannot directly be connected to the gate of the amplifying MOS transistor. Therefore, as in the signal charge accumulation structure using a photogate PG, the transfer gate TG electrode and floating diode TD regions are necessary and such additional regions hamper increase in the pixel density in CMOS solid state imaging devices.

Other problems of related art CMOS solid state imaging devices include deteriorated resolution and mixed color in color imaging.

SUMMARY OF THE INVENTION

The present invention is made in view of the above circumstances and the purpose of the present invention is to realize a solid state imaging device having reduced mixed color, residual images, dark current, and noise, high sensitivity, and a high pixel density.

In order to achieve the above purposes, the solid state imaging device of the present invention is a solid state imaging device including one or more pixels, each of the pixels comprising: a first semiconductor layer formed on a substrate; a second semiconductor layer formed on the first semiconductor layer; a fourth semiconductor layer formed in the lateral side of the upper region of the second semiconductor layer away from a top surface of the second semiconductor layer; a third semiconductor layer formed between an inner side of the fourth semiconductor layer and the second semiconductor layer away from the top surface of the second semiconductor layer; a first insulating film formed at least on the side of the second semiconductor layer and on the outer side of the fourth semiconductor layer; a gate conductor layer formed on the side of the lower region of the second semiconductor layer via the first insulating film, the third semiconductor layer being not formed in the lower region of the second semiconductor layer; a conductor electrode formed on the outer side of the fourth semiconductor layer via the first insulating film; and a fifth semiconductor layer formed on the top surface of the second semiconductor layer so as not to be in contact with the third semiconductor layer and the fourth semiconductor layer, wherein at least the third semiconductor layer, the upper region of the second semiconductor layer where the third semiconductor layer is formed, the fourth semiconductor layer, and the fifth semiconductor layer are formed in the shape of an island, a diode comprises the third semiconductor layer and a region of the second semiconductor layer which is adjacent to the third semiconductor layer, a junction transistor comprises: one of the fifth semiconductor layer and the region of the second semiconductor layer which is adjacent to the first semiconductor layer serving as a drain of the junction transistor; the other of the fifth semiconductor layer and the region of the second semiconductor layer which is adjacent to the first semiconductor layer serving as a source of the junction transistor; and the diode serving as a gate of the junction transistor, and a field effect transistor comprises: the first semiconductor layer serving as a drain of the field effect transistor; the third semiconductor layer serving as a source of the field effect transistor; and the gate conductor layer serving as a gate of the field effect transistor, and the solid state imaging device (100) further comprising: means for accumulating a signal charge in the diode, the signal charge generated in the pixel by irradiation of electromagnetic energy wave; signal reading means for measuring a current running through the junction transistor so as to measure a quantity of the signal charge accumulated in the diode, the current being changed according to the quantity of the signal charge accumulated in the diode; and reset means for applying an ON voltage to the gate conductor layer of the field effect transistor to create a channel in a region including a region of the second semiconductor layer which is between the first semiconductor layer and the third semiconductor layer, whereby the signal charge accumulated in the diode is transferred to the first semiconductor layer and removed, a voltage is applied to the conductor electrode so that a charge having a polarity opposite to a polarity of the signal charge accumulated in the diode is accumulated in the fourth semiconductor layer.

The present invention provides a solid state imaging device having reduced mixed color, residual images, dark current, and noise, high sensitivity, and a high pixel density.

BRIEF DESCRIPTION OF THE DRAWINGS

A more complete understanding of this application can be obtained when the following detailed description is considered in conjunction with the following drawings, in which.

DETAILED DESCRIPTION OF THE PREFERRED EMBODIMENTS

Embodiments of the present invention will be described hereafter with reference to FIGS. 1A to 17.

Embodiment 1

Figure 1A:
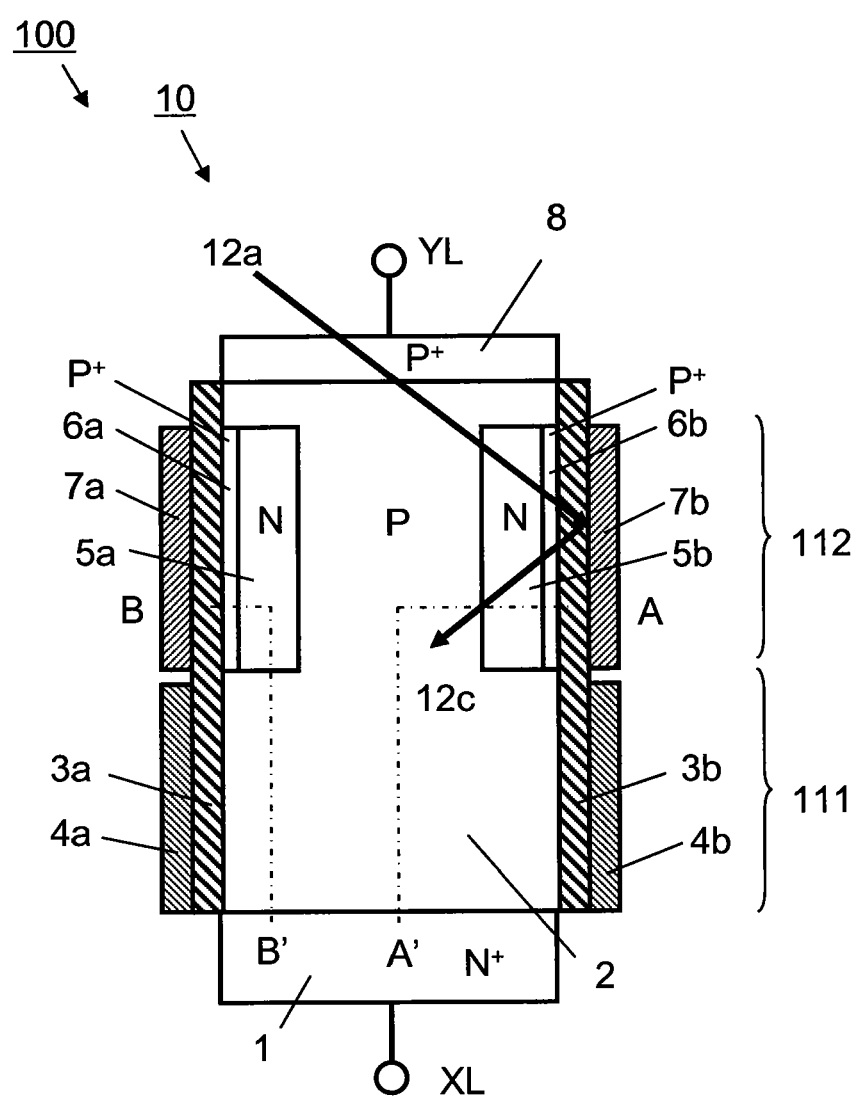
FIG. 1A is an illustration showing the pixel structure of a solid state imaging device according to Embodiment 1 of the present invention.
Figure 1B:
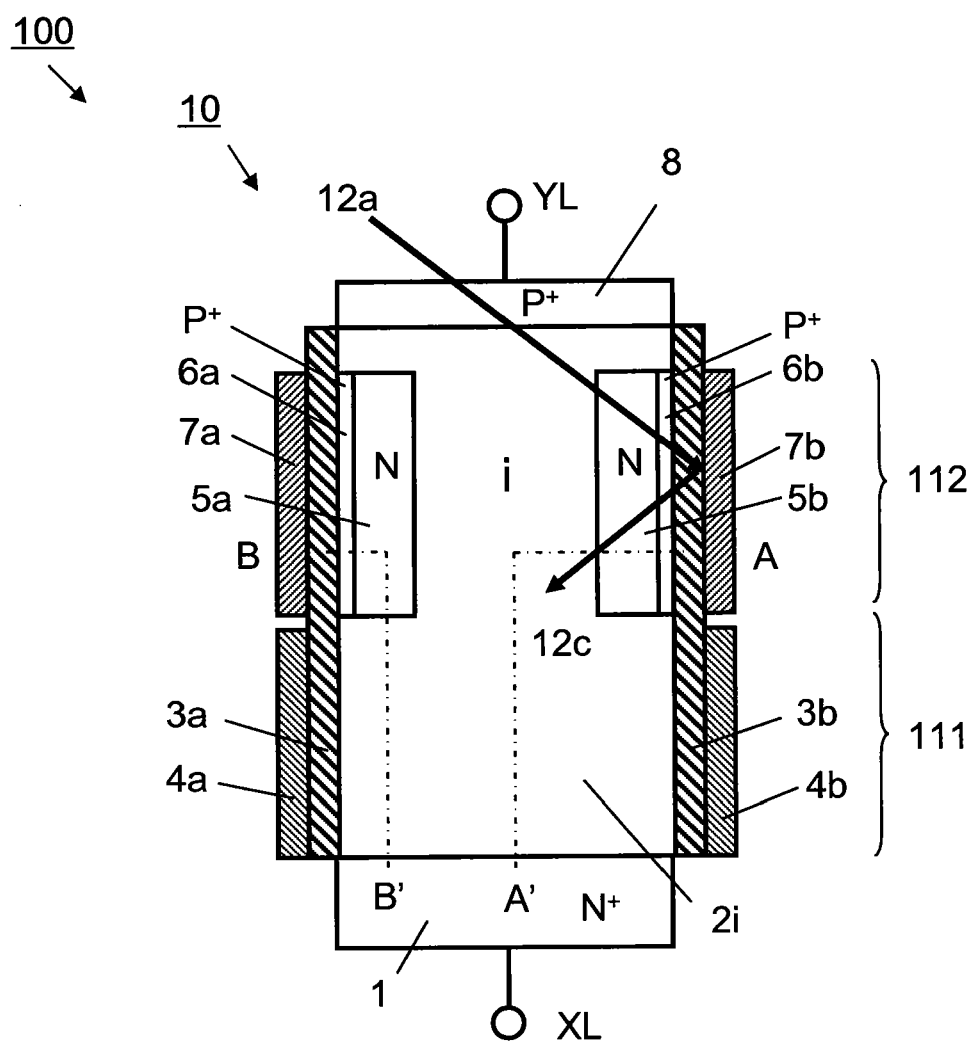
FIG. 1B is an illustration showing the pixel structure of a solid state imaging device according to a modified example of Embodiment 1 of the present invention.

FIGS. 1A and 1B show the structure of a pixel 10 of a solid state imaging device 100 according to Embodiment 1 of the present invention. The pixel 10 of the solid state imaging device 100 according to this Embodiment has the similar basic structure to the pixel of the solid state imaging device described in International Publication No. WO 2009/034623, the content of which is entirely incorporated herein by reference.

In FIG. 1A, an individual pixel 10 has a first semiconductor $N^+$ layer 1 formed on a substrate and connected to a wire XL extending in a first scanning direction. A second semiconductor P layer 2 having a conductivity type opposite to that of the first semiconductor $N^+$ layer 1 is formed on the first semiconductor $N^+$ layer 1. Formed on the upper side of the second semiconductor P layer 2, a third semiconductor N layer 5a, 5b having the same conductivity type as that of the first semiconductor $N^+$ layer 1 enclose the second semiconductor P layer 2. Here, the third semiconductor N layer 5a, 5b is not in contact with the top surface of the second semiconductor P layer 2. The third semiconductor N layer 5a, 5b and the region of the second semiconductor P layer 2 which is adjacent to the third semiconductor N layer 5a, 5b constitute a photodiode 112 in which signal charges generated upon irradiation of electromagnetic energy wave such as light, X ray, and an electron beam are accumulated.

Furthermore, formed on the surface of the photodiode 112, a fourth semiconductor $P^+$ layer 6a, 6b having a conductivity type opposite to that of the first semiconductor $N^+$ layer 1 enclose the outer periphery of the photodiode 112. Here, the fourth semiconductor $P^+$ layer 6a, 6b is not in contact with the top surface of the second semiconductor P layer 2.

An insulating film ($SiO_2$ film) 3a, 3b is formed to cover the side of the second semiconductor P layer 2 and the outer side of the fourth semiconductor $P^+$ layer 6a, 6b. A conductor electrode 7a, 7b is formed on the side of the fourth semiconductor $P^+$ layer 6a, 6b via the insulating film 3a, 3b.

A gate conductor layer 4a, 4b is formed on the lower side of the second semiconductor P layer 2 via the insulating film 3a, 3b. The gate conductor layer 4a, 4b is made of a light-blocking material such as a metal film and sufficiently thick, heavily-doped polycrystalline Si. The insulating film 3a, 3b and the gate conductor layer 4a, 4b constitute a MOS transistor 111 of which the channel comprises the lower region of the second semiconductor P layer 2.

A fifth semiconductor $P^+$ layer 8 having the same conductivity type as that of the second semiconductor P layer 2 is formed on the top surface of the second semiconductor P layer 2. The fifth semiconductor $P^+$ layer 8 is spaced from the third semiconductor N layer 5a, 5b and the fourth semiconductor $P^+$ layer 6a, 6b. The fifth semiconductor $P^+$ layer 8 is connected to a wire YL extending in the direction orthogonal to the first scanning direction.

A junction transistor of which the drain and source comprise the fifth semiconductor $P^+$ layer 8 and the region of the second semiconductor P layer 2 which is adjacent to the first semiconductor $N^+$ layer 1 and of which the gate comprises the photodiode 112 is formed. The upper region of the second semiconductor P layer 2 where the photodiode 112 is formed, the third semiconductor N layer 5a, 5b, the fourth semiconductor $P^+$ layer 6a, 6b, and the fifth semiconductor $P^+$ layer 8 are formed in the shape of an island. In this embodiment, the wire XL is a signal line and the wire YL is a pixel selection line. However, the wires XL and YL can be a pixel selection line and a signal line, respectively.

Figure 18A:
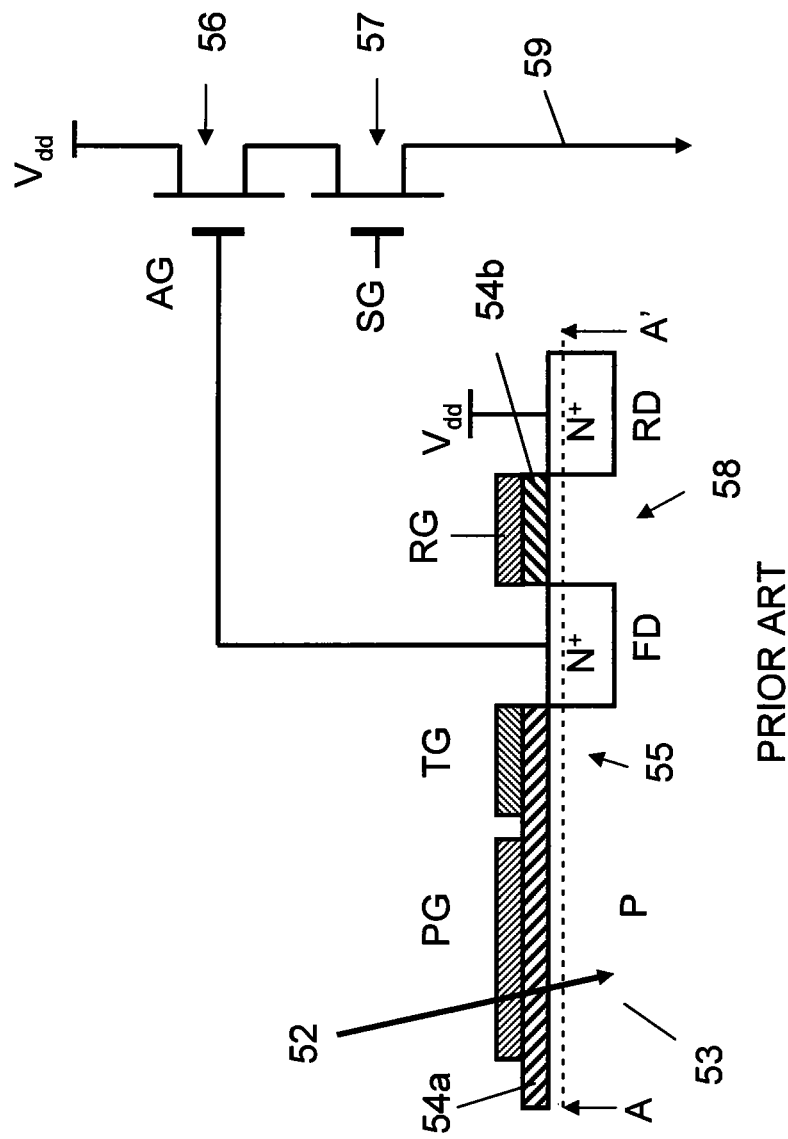
FIG. 18A is an illustration showing a pixel structure for explaining a related art solid state imaging device.
Figure 18B:
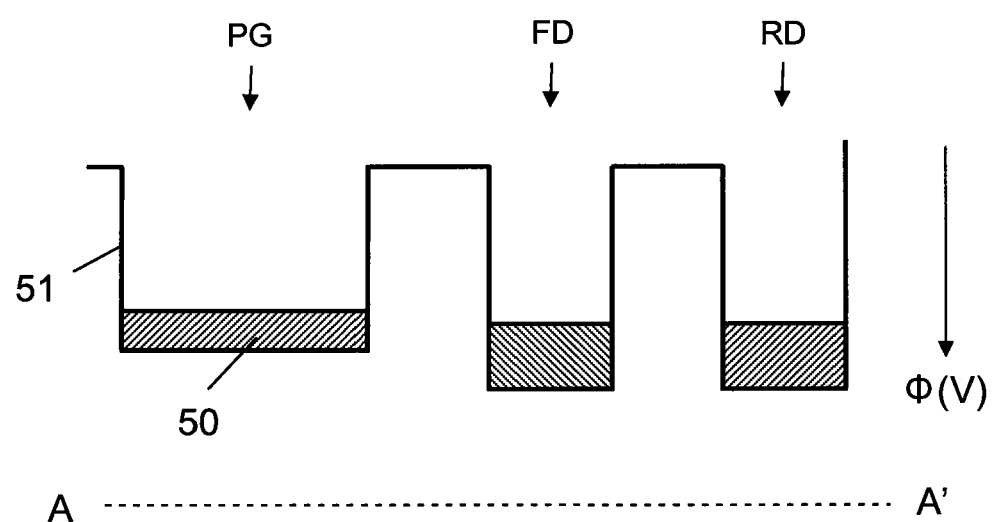
FIG. 18B is an illustration showing a potential profile for explaining a related art solid state imaging device.

In the pixel 10 having the above structure, since the conductor electrode 7a, 7b on the photodiode 112 is formed on the side of the island-shaped semiconductor, incident light 12a directly enters the photodiode region through the fifth semiconductor $P^+$ layer 8. Therefore, the solid state imaging device 100 according to this Embodiment can prevent deterioration in sensitivity to blue wavelength light, which occurs in the related art solid state imaging device as shown in FIG. 18A. Furthermore, the conductor electrode 7a, 7b is made of a light-blocking material such as a metal film and sufficiently thick, heavily-doped polycrystalline Si. Therefore, the incident light 12a entering the photodiode region from the fifth semiconductor $P^+$ layer 8 is absorbed or reflected by the conductor electrode 7a, 7b. Furthermore, since the conductor electrode 7a, 7b encloses the outer periphery of the photodiode 112, the incident light 12a and the reflected light 12c reflected by the conductor electrode 7a, 7b do not leak into adjacent pixels. Both the incident light 12a and the reflected light 12c effectively contribute to signal charges. Consequently, the solid state imaging device 100 prevents mixed color and deteriorated resolution.

In the solid state imaging device shown in FIG. 1A, the second semiconductor layer is a P layer 2 made of a P-type semiconductor. However, as illustrated in FIG. 1B, an i layer 2i made of a substantially intrinsic type semiconductor layer can be used instead of the P layer 2. Although the substantially intrinsic semiconductor is made without including impurities, it is inevitable that a tiny amount of impurity is contained in the substantially intrinsic semiconductor. As long as the substantially intrinsic semiconductor layer constituting an i layer 2i does not impede the function of the solid state imaging device 100, it can contain a small amount of acceptor or donor impurity. With this type of configuration, a photodiode can be formed by the third semiconductor N layer 5a, 5b and the second semiconductor i layer 2i. When sufficient voltage is applied between the fifth semiconductor $P^+$ layer 8 and the signal line N⁺ layer 1, holes in the fifth semiconductor P⁺ layer 8 flow towards the signal line N⁺ layer 1 according to the potential gradient generated within the second semiconductor i layer 2i. In this way, the second semiconductor i layer 2i also serves as a channel of the junction transistor.

Figure 2:
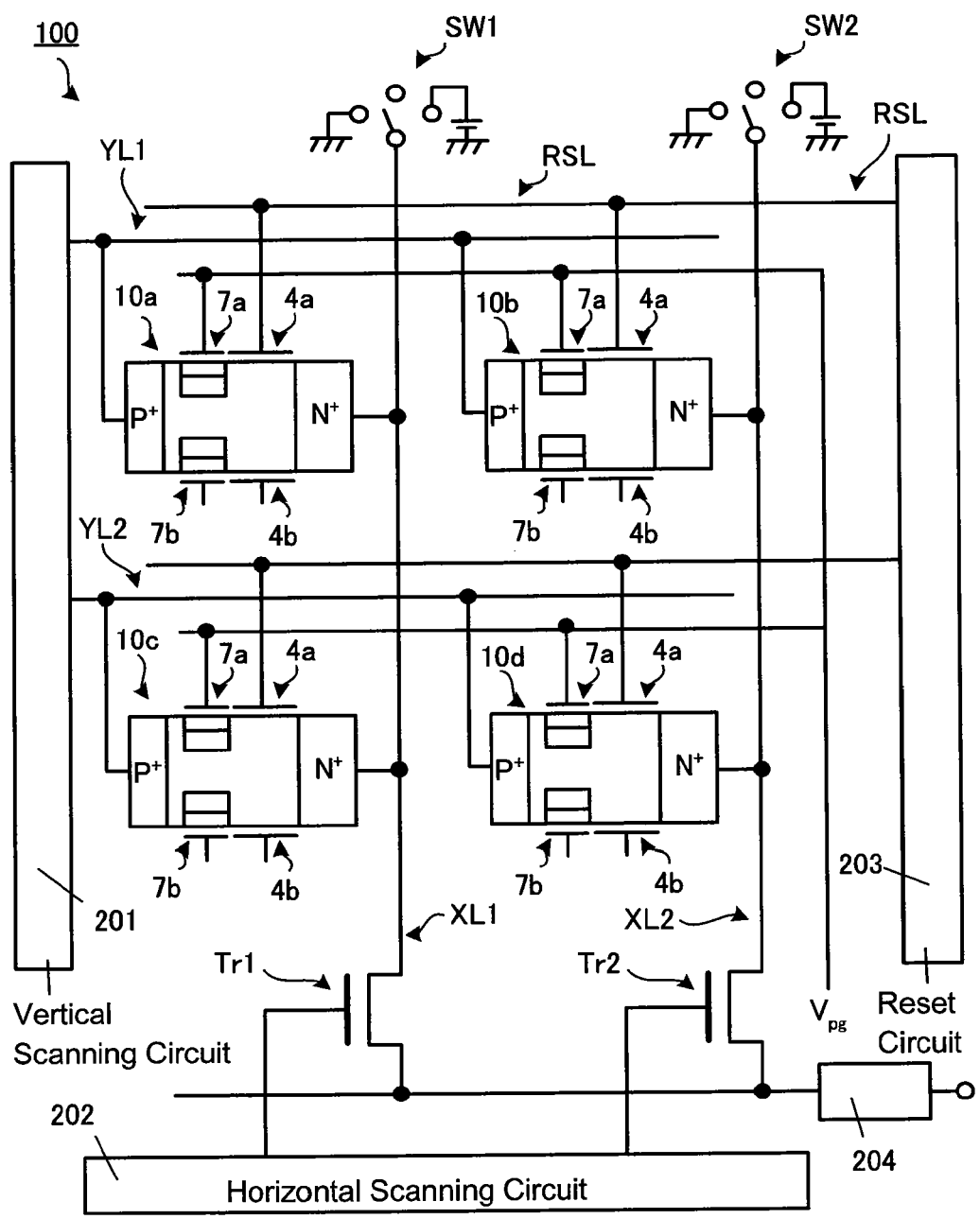
FIG. 2 is an illustration showing an exemplary circuit configuration of a solid state imaging device according to Embodiment 1.

FIG. 2 shows an exemplary circuit configuration of the solid state imaging device 100 according to this embodiment. The solid state imaging device 100 primarily comprises multiple pixels 10a to 10d arranged in a two-dimensional matrix, a vertical scanning circuit 201, a horizontal scanning circuit 202, a reset circuit 203, pixel selection lines YL1 and YL2, signal lines XL1 and XL2, reset lines RSL, signal line MOS transistors Tr1 and Tr2, and a correlated double sampling (CDS) output circuit 204. This Embodiment will be described as a case in which the pixels 10a to 10d are arranged in two rows and two columns. However, the solid state imaging device of the present invention is not restricted to this case.

As shown in FIG. 2, the vertical scanning circuit 201 supplying pixel selection signals to the pixels 10a to 10d are connected to the pixels 10a to 10d via the pixel selection lines YL1 and YL2 on a row basis. The pixels 10a to 10d are also connected to the CDS output circuit 204 via the signal lines XL1 and XL2 on a column basis. The gate electrodes of the signal line MOS transistors Tr1 and Tr2 provided on the individual signal lines XL1 and XL2 are connected to the horizontal scanning circuit 202 supplying signal line selection signals to these gate electrodes. The signals lines XL1 and XL2 are also connected to switching parts SW1 and SW2, respectively. The gate conductor layers 4a, 4b of the MOS transistors for reset operation are connected to the reset circuit 203 supplying reset signals to the gate conductor layers 4a, 4b via the reset lines RSL. Furthermore, the conductor electrodes 7a, 7b on the photodiodes of the pixels 10a to 10d are connected to an external voltage $V_{pg}$. With operation of the above circuit configuration, the signal currents of the pixels 10a to 10d are read from the CDS output circuit 204 in sequence.

Basic operation of the solid state imaging device 100 according to this Embodiment will be described hereafter with reference to FIGS. 1A to 3D. In the potential profile of FIG. 3A, accumulated signal charges are shown by hatching for distinction.

The basis operation of this device comprises signal charge accumulation, signal reading, and reset.

In the signal charge accumulation operation, signal charges generated upon irradiation of electromagnetic energy wave such as light, X ray and an electron beam are accumulated in the photodiode 112.

In the signal reading operation, a current running between the fifth semiconductor P⁺ layer 8 and the region of the second semiconductor P layer 2 which is adjacent to the first semiconductor N⁺ layer 1 is measured so that the signal charges accumulated in the photodiode 112 are measured. With the photodiode 112 serving as the gate of the amplifying junction transistor, the current running between the second semiconductor P layer 2 adjacent to the first semiconductor N⁺ layer 1 and the fifth semiconductor P⁺ layer 8 changes according to the signal charges accumulated in the photodiode 112. Therefore, the accumulated signal charge packets can be read by measuring this current.

In the reset operation, an ON voltage is applied to the gate conductor layer 4a, 4b of the MOS transistor 111 to transfer the signal charges accumulated in the photodiode 112 to the first semiconductor N⁺ layer 1 for removal.

Figure 3A:
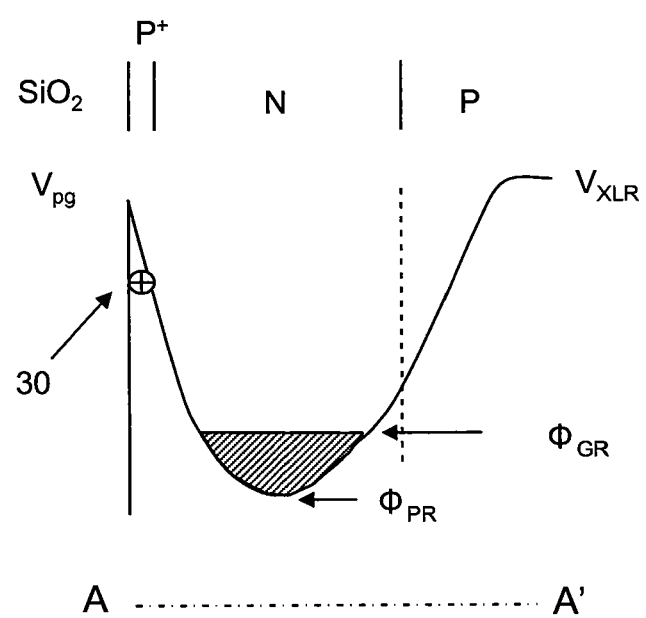
FIG. 3A is an illustration showing a potential profile for explaining a solid state imaging device according to Embodiment 1.

FIG. 3A is an illustration showing the potential profile along the line A-A' in FIG. 1A during the signal charge accumulation. $\Phi_{PR}$ is the deepest potential in the third semiconductor N layer 5a, 5b when no signal charge is accumulated.

During the signal charge accumulation, the voltage $V_{pg}$ of the conductor electrode 7a, 7b is set so that the fourth semiconductor P⁺ layer 6a, 6b has a potential equal to or close to the ground potential. In an exemplary setting, $V_{pg}=0$ V, the voltage of the signal line XL $V_{XLR}=0$ V, and the voltage of the pixel selection line YL $V_{YLR}=0$ V. In this way, the potential profile as shown in FIG. 3A is obtained and signal charges are accumulated in the third semiconductor N layer 5a, 5b as shown by hatching. The photodiode potential $\Phi_{GR}$ is changed according to the accumulated signal charges.

Furthermore, with the fourth semiconductor P⁺ layer 6a, 6b having a potential equal to or close to the ground potential, many holes 30 are accumulated in the fourth semiconductor P⁺ layer 6a, 6b. The holes 30 are supplied from the second semiconductor P layer 2 between the fourth semiconductor P⁺ layer 6a, 6b and the fifth semiconductor P⁺ layer 8. Electrons thermally generated as a result of the trap level of the interface between the insulating film 3a, 3b and the fourth semiconductor P⁺ layer 6a, 6b and causing dark current are recombined with the holes 30 accumulated in the fourth semiconductor P⁺ layer 6a, 6b and disappear, thus preventing dark current.

In order to prevent dark current, for example, it is possible to connect the fifth semiconductor P⁺ layer 8 to the fourth semiconductor P⁺ layer 6a, 6b and set the potential of the fourth semiconductor P⁺ layer 6a, 6b to the ground potential. However, in such a case, the potential of the fourth semiconductor P⁺ layer 6a, 6b is not always fixed to the ground potential and more easily affected by the potential of the fifth semiconductor P⁺ layer 8 that changes during the imaging. Conversely, in the solid state imaging device 100 according to this embodiment, the potential of the fourth semiconductor P⁺ layer 6a, 6b is set by the conductor electrode 7a, 7b, preventing deterioration in image characteristics due to noise caused by change in the potential of the fifth semiconductor P⁺ layer 8.

Figure 3B:
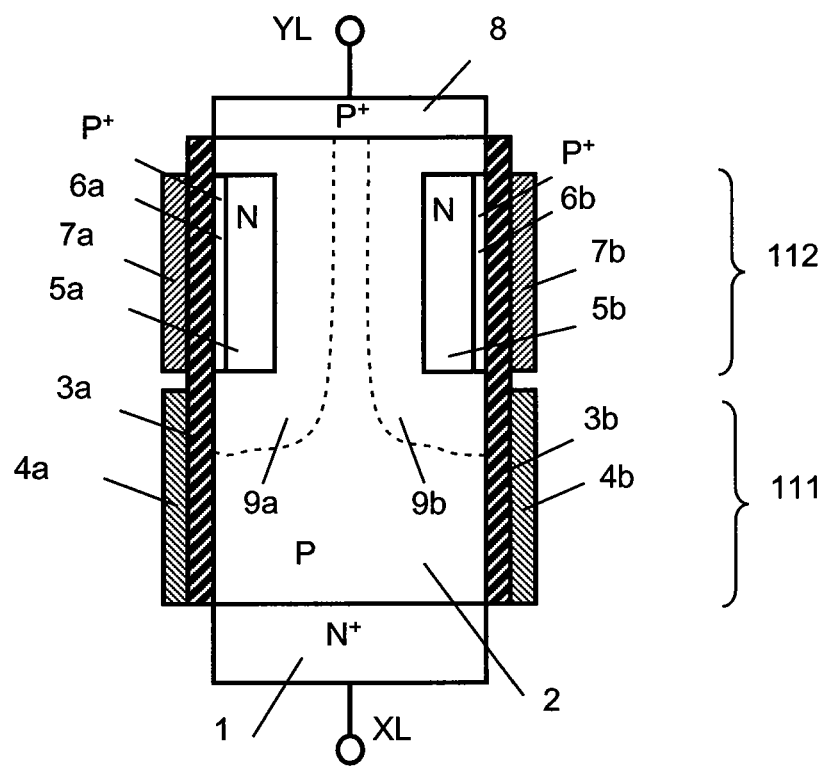
FIG. 3B is an illustration showing a pixel structure for explaining a solid state imaging device according to Embodiment 1.
Figure 3C:
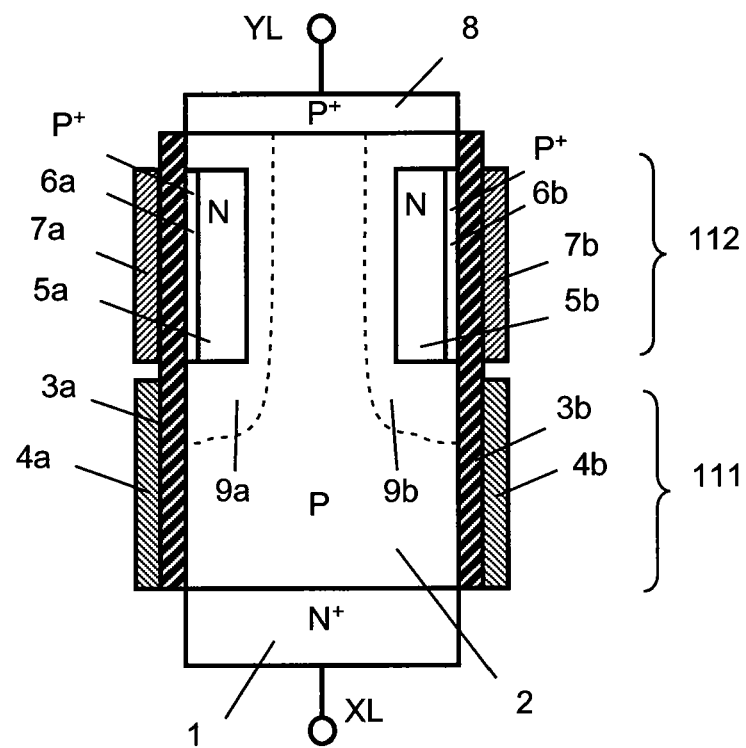
FIG. 3C is an illustration showing a pixel structure for explaining a solid state imaging device according to Embodiment 1.

FIG. 3B is an illustration showing the structure of a pixel when no signal charge is accumulated in the photodiode 112 during the signal reading. Here, the photodiode 112 has a depleted layer 9 (9a and 9b) as marked by broken lines. In this embodiment, when no signal charge is accumulated in the photodiode 112, the depleted layers 9a and 9b of the photodiode 112 are formed in parts of the upper region of the second semiconductor P layer 2 where the photodiode 112 is formed. When signal charges are accumulated in the photodiode 112, as shown in FIG. 3C, the width of the depleted layers 9a and 9b is decreased and the width of the channel of the amplifying junction transistor formed in the second semiconductor P layer 2 is increased. A current according to the width of the channel of the amplifying junction transistor, namely to the accumulated signal charge packets runs through the channel during the signal reading.

The voltage of the conductor electrode 7a, 7b can be set so that the fourth semiconductor P⁺ layer 6a, 6b has a potential nearly equal to the ground potential during the signal reading. In this way, the holes 30 can be accumulated in the surface region of the fourth semiconductor P⁺ layer 6a, 6b. Consequently, influence of change in the voltage of the gate conductor layer 4a, 4b of the MOS transistor 111 on the photodiode potential is diminished, whereby the solid state imaging device 100 according to this embodiment can stably operate.

Figure 3D:
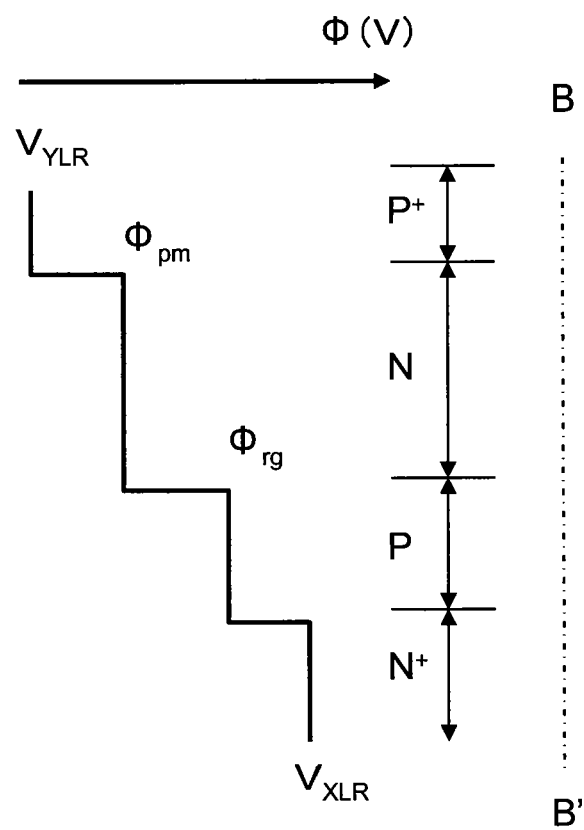
FIG. 3D is an illustration showing a potential profile for explaining a solid state imaging device according to Embodiment 1.

FIG. 3D shows the potential profile at the line B-B' in FIG. 1A during the reset. In the reset operation, the voltage $V_{XLR}$ of the signal line XL, the voltage $V_{YLR}$ of the pixel selection line YL, and the voltage $V_{pg}$ of the conductor electrode 7a, 7b are set so that the potentials become deeper in the following order: the potential $V_{YLR}$ of the fifth semiconductor P⁺ layer 8, the deepest potential $\Phi_{pm}$ in the third semiconductor N layer 5a, 5b when no signal charge is accumulated, the potential $\Phi_{rg}$ of the channel of the MOS transistor 111 of the second semiconductor P layer 2 when an ON voltage is applied to the gate conductor layer 4a, 4b of the MOS transistor, and the potential $V_{XLR}$ of the first semiconductor N⁺ layer 1. With the above potential relationship, the signal charges accumulated in the photodiode 112 do not stay in the photodiode 112 but are transferred to the first semiconductor N⁺ layer 1 and removed, thus preventing residual images. Furthermore, no current runs through the channel of the reset MOS transistor 111 after the signal charges are transferred to the signal line XL, preventing kTC noise. The potential $\Phi_{pm}$ in the third semiconductor N layer 5a, 5b can be controlled by the voltage $V_{pg}$ of the conductor electrode 7a, 7b. Therefore, the potential $\Phi_{pm}$ in the third semiconductor N layer 5a, 5b can be set so that the potential $V_{XLR}$ of the first semiconductor N⁺ layer 1, which is the deepest during the reset, is shallower. Then, the solid state imaging device 100 can utilize a lower drive voltage.

Embodiment 2

Figure 4:
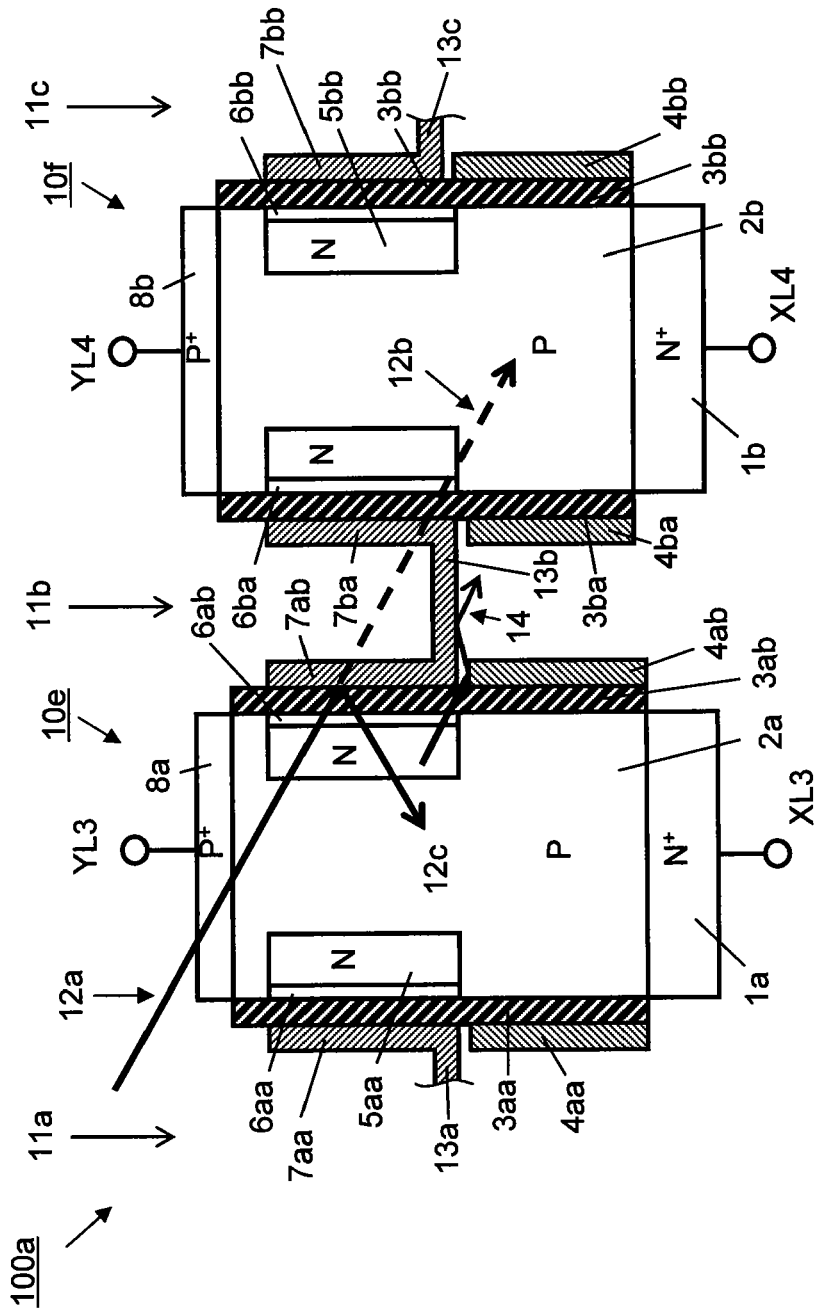
FIG. 4 is an illustration showing a pixel structure for explaining a solid state imaging device according to Embodiment 2 of the present invention.

FIG. 4 is a cross-sectional view of two adjacent pixels 10e and 10f for explaining a solid state imaging device 100a according to Embodiment 2 of the present invention. The same components as those of the solid state imaging device 100 according to Embodiment 1 are referred to by the same reference numbers. The components of a pixel 10e are referred to by reference numbers with a suffix aa or ab and the components of a pixel 10f are referred to by reference numbers with a suffix ba or bb. This embodiment is different from Embodiment 1 in that the conductor electrodes 7aa, 7ab, 7ba, and 7bb of the pixels 10e and 10f are connected to each other near the gate conductor layers 4aa, 4ab, 4ba, and 4bb. In this embodiment, the pixel selection line is comprised of the conductor electrodes 7aa, 7ab, 7ba, and 7bb and wiring conductor layers 13a to 13c connecting the conductor electrodes 7aa, 7ab, 7ba, and 7bb of adjacent pixels. In this embodiment, the conductor electrodes 7aa, 7ab, 7ba, and 7bb and wiring conductor layers 13a to 13c are integrally joined.

The conductor electrodes 7aa, 7ab, 7ba and 7bb and the wiring conductor layers 13a to 13c are made of a light-blocking material such as a metal film and sufficiently thick, heavily-doped polycrystalline silicon (Si). Therefore, for example, light (incident light) 12a entering the fifth semiconductor P⁺ layer 8a of the pixel 10e is reflected by the conductor electrodes 7ab and 7ba and the wiring conductor layer 13b. The light reflected in this way (reflected light) 12c generates effective signal charges in the pixel 10e. Furthermore, there is no leaked light 12b into the adjacent pixel 10f as shown by a broken line in FIG. 4. With the conductor electrodes 7aa, 7ab, 7ba, and 7bb being connected near the gate conductor layers 4aa, 4ab, 4ba, and 4bb, light 14 entering the inter-pixel spaces 11a, 11b, and 11c (light leaking into an inter-pixel space) is reflected or absorbed by the wiring conductor layers 13a to 13c as shown in FIG. 4. Therefore, the light 14 is not allowed to enter the second semiconductor P layers 2a and 2b of the pixels 10e and 10f along the optical path between the gate electrodes 4aa, 4ab, 4ba, and 4bb and the conductor electrodes 7aa, 7ab, 7ba, and 7bb before it reaches the bottom of the pixel 10e or 10f. Consequently, mixed color and deteriorated resolution are prevented.

In FIG. 4, the conductor electrodes 7aa, 7ab, 7ba, and 7bb connect the pixels 10e and 10f arranged in the shown direction (in the horizontal direction). They can connect the pixels arranged in the vertical direction. In such a case, mixed color and deteriorated resolution can similarly be prevented.

Furthermore, as shown in FIG. 2, the conductor electrodes 7a, 7b of all pixels 10a to 10d in the light-sensitive region of the solid state imaging device 100a according to this embodiment can be connected so that they can be connected to a single external voltage $V_{pg}$. In such a case, the conductor electrodes 7aa, 7ab, 7ba, and 7bb and the wiring conductor layers 13a to 13c are formed to cover the entire surface of the inter-pixel spaces 11a to 11c in the light-sensitive region. Such a structure completely prevents light that has entered the inter-pixel spaces 11a to 11b from entering the second semiconductor P⁺ layers Embodiment 3

Figure 5:
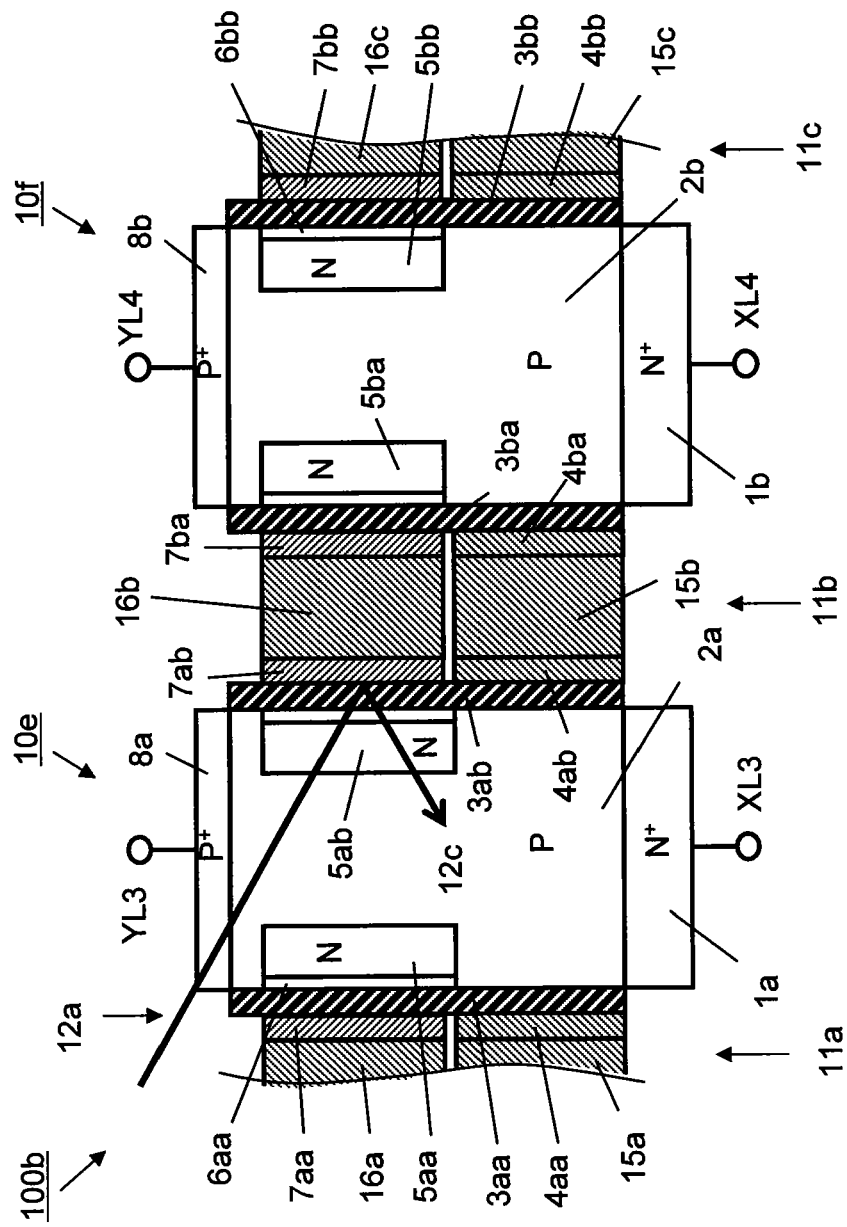
FIG. 5 is an illustration showing a pixel structure for explaining a solid state imaging device according to Embodiment 3 of the present invention.

FIG. 5 is a cross-sectional view of two pixels 10e and 10f for explaining a solid state imaging device 100b according to Embodiment 3 of the present invention. The same components as those of the solid state imaging device 100a according to Embodiment 2 are referred to by the same reference numbers. In the solid state imaging device 100a according to Embodiment 2, the conductor electrodes 7aa, 7ab, 7ba, and 7bb are connected to each other near the gate conductor layers 4aa, 4ab, 4ba, and 4bb. On the other hand, in the solid state imaging device 100b according to this embodiment, filling conductor layers 15a to 15c and 16a to 16c fill both or one of the space between the conductor electrodes 7aa, 7ab, 7ba, and 7bb and the space between the gate conductor layers 4aa, 4ab, 4ba, and 4bb in the inter-pixel spaces 11a to 11c of the pixels 10e and 10f. FIG. 5 shows both spaces filled with the filling conductor layers 15a to 15c and 16a to 16c. In such a case, the conductor electrodes 7aa, 7ab, 7ba, and 7bb and the gate conductor layers 4aa, 4ab, 4ba, and 4bb are provided in the same wiring direction. When they are provided in the wiring directions orthogonal to each other, either the space between the conductor electrodes 7aa, 7ab, 7ba, and 7bb or the space between the gate conductor layers 4aa, 4ab, 4ba, and 4bb will be filled with the filling conductor layers 15a to 15c or 16a to 16c in FIG. 5.

The filling conductor layers 15a to 15c and 16a to 16c are made of a light-blocking material such as a metal film and sufficiently thick, heavily doped polycrystalline Si. Therefore, for example, light 12a entering the fifth semiconductor P⁺ layer 8a of the pixel 10e is reflected by the gate conductor layers 4ab and 4ba and the conductor electrodes 7ab and 7ba. The light reflected in this way (reflected light) 12c generates effective signal charges in the pixel 10e. Furthermore, even if the incident light 12a and the reflected light 12c leaks between the gate conductor layers 4aa, 4ab, 4ba, and 4bb and the conductor electrodes 7aa, 7ab, 7ba, and 7bb, the leaked light is reflected or absorbed by the filling conductor layers 15a to 15c and 16a to 16c. Therefore, intrusion of the incident light 12a and the reflected light 12c into the second semiconductor P layers 2a and 2b of the adjacent pixels 10e and 10f can effectively be prevented. Consequently, deteriorated resolution or mixed color can effectively be prevented.

Embodiment 4

Figure 6:
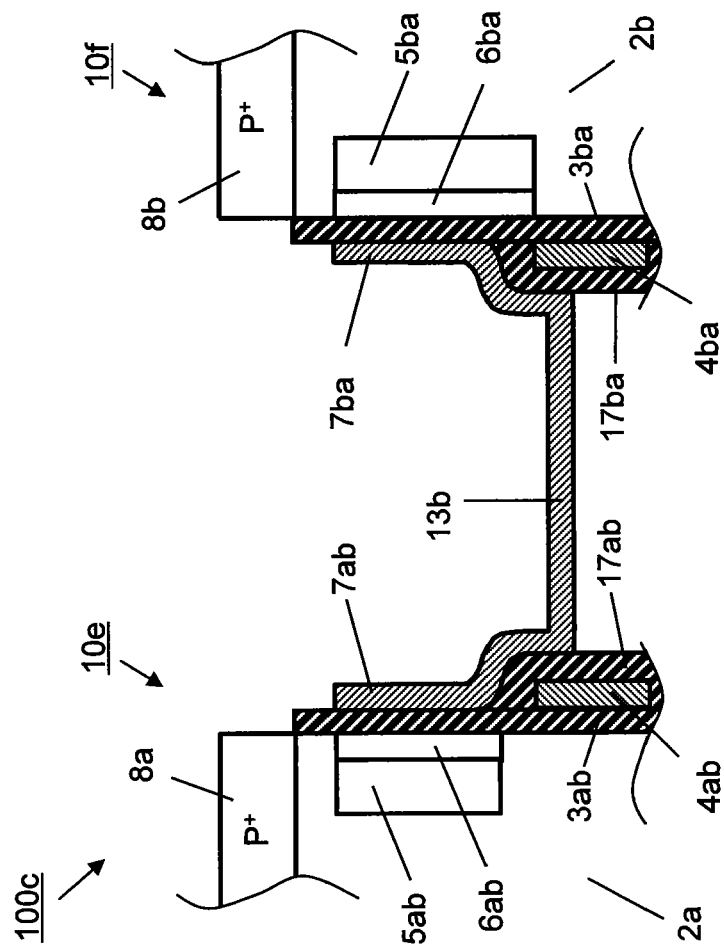
FIG. 6 is an enlarged view of a partial pixel structure for explaining a solid state imaging device according to Embodiment 4 of the present invention.

FIG. 6 shows a pixel structure for explaining a solid state imaging device 100c according to Embodiment 4 of the present invention. The same components as those of the solid state imaging device 100a according to Embodiment 2 are referred to by the same reference numbers. This figure is an enlarged cross-sectional view of a region part including the second semiconductor P layers 2a and 2b, the gate conductor layers 4ab and 4ba, the third semiconductor N layers 5ab and 5ba, the fourth semiconductor P$^+$ layers 6ab and 6ba, the conductor electrodes 7ab and 7ba, and the fifth semiconductor P$^+$ layers 8a and 8b. Here, the conductor electrodes 7ab and 7ba are connected to each other via a wiring conductor layer 13b. This embodiment is different from the solid state imaging device 100a according to Embodiment 2 in that the conductor electrodes 7ab and 7ba overlap at least with at least part of the gate conductor layers 4ab and 4ba, respectively, via insulting layers 17ab and 17ba covering the gate conductor layers 4ab and 4ba.

In the solid state imaging device 100c, there is no gap between the gate conductor layers 4ab and 4ba and conductor electrodes 7ab and 7ba. Therefore, no light leaks through such a gap. Consequently, leakage of light into adjacent pixels can be prevented more effectively than the embodiments described above.

In this embodiment, the conductor electrodes 7ab and 7ba are connected to each other. Even if the conductor electrodes 7a and 7b are not connected to each other as in the solid state imaging device 100 according to Embodiment 1, the conductor electrode 7a, 7b overlapping with the gate conductor layer 4a, 4b can more effectively prevent leakage of light into adjacent pixels as described above.

A method of producing the solid state imaging device 100c according to Embodiment 4 will be described hereafter with reference to FIGS. 7 to 15.

Figure 7:
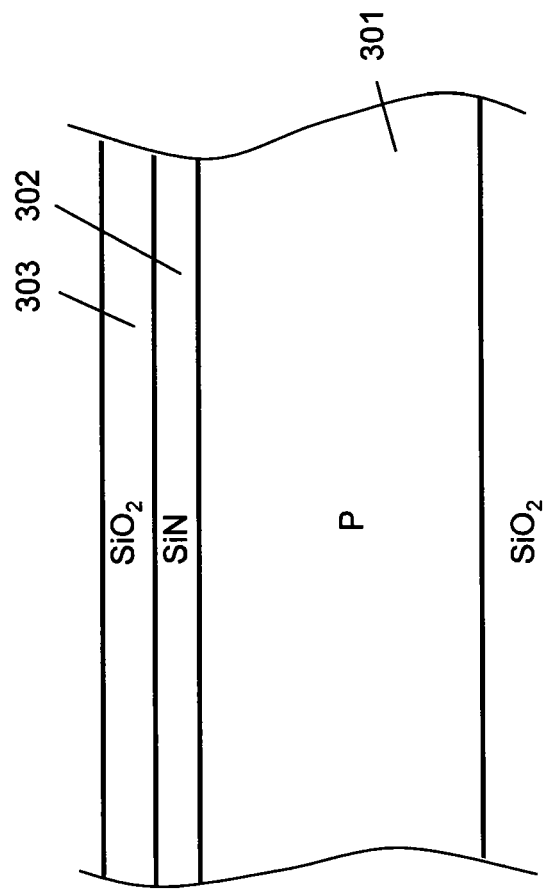
FIG. 7 is an illustration for explaining a method of producing the solid state imaging device according to Embodiment 4.
Figure 8:
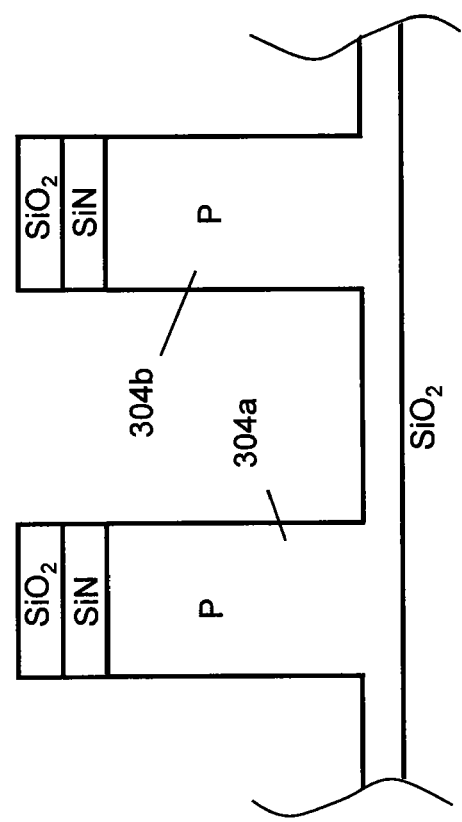
FIG. 8 is an illustration for explaining a method of producing the solid state imaging device according to Embodiment 4.
Figure 9:
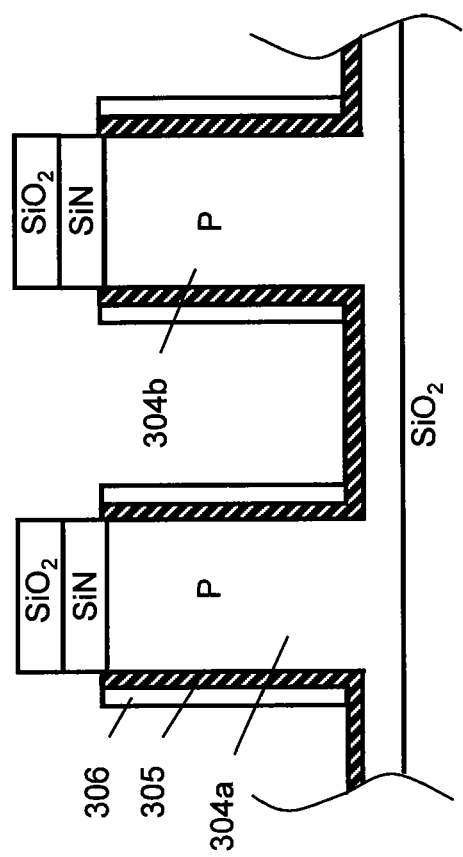
FIG. 9 is an illustration for explaining a method of producing the solid state imaging device according to Embodiment 4.

First, as shown in FIG. 7, a P-type silicon layer 301, a silicon nitride layer 302, and a silicon oxide layer 303 are deposited on a silicon (for example, SiO$_2$) substrate. Then, as shown in FIG. 8, island-shaped semiconductor layers 304a and 304b are formed by etching. Then, for example, the resultant substrate is heated in an oxygen atmosphere to oxidize the silicon surface and form a silicon oxide film 305. Then, polysilicon is deposited on the resultant substrate and etched back to form a polysilicon sidewall film 306 as shown in FIG. 9.

Figure 10:
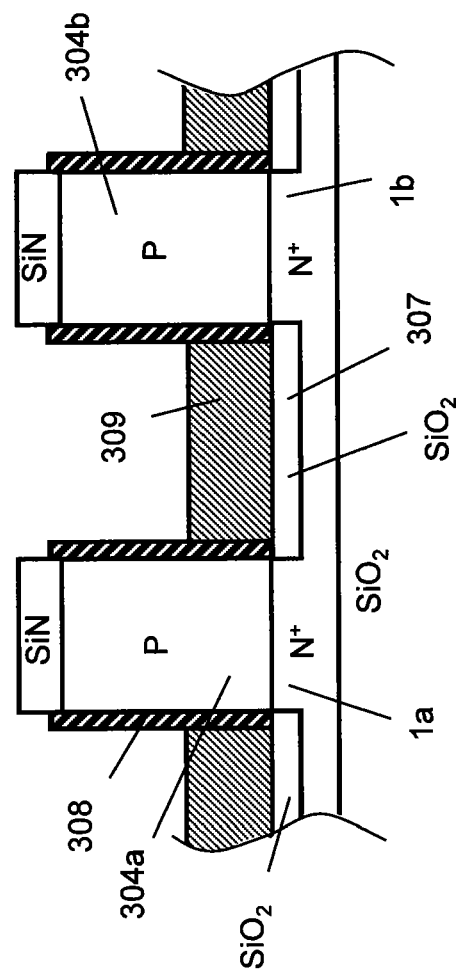
FIG. 10 is an illustration for explaining a method of producing the solid state imaging device according to Embodiment 4.
Figure 11:
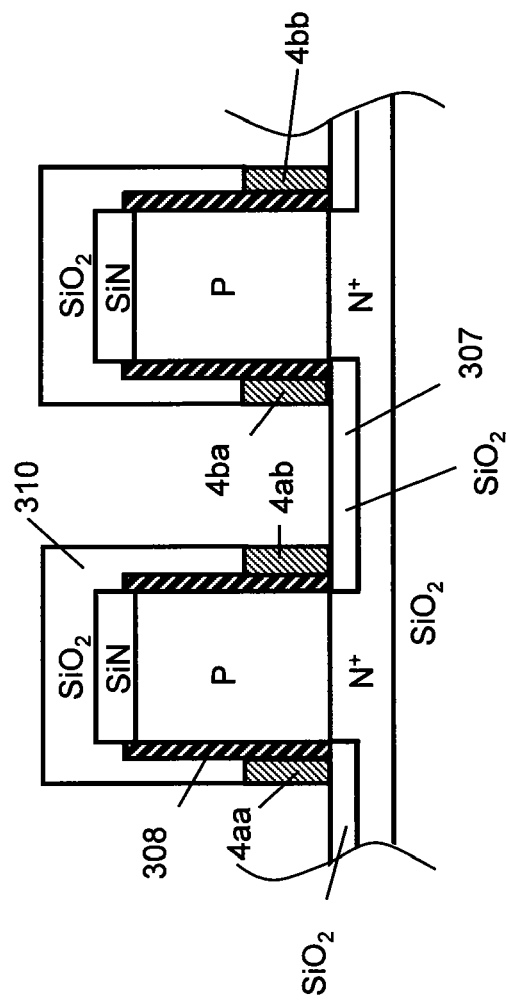
FIG. 11 is an illustration for explaining a method of producing the solid state imaging device according to Embodiment 4.

Then, phosphorus ions are implanted in the P-type silicon layer 301 by ion implantation to form the first semiconductor N$^+$ layers 1a and 1b. Then, the polysilicon film 306 and silicon oxide film 305 are removed off. Then, a silicon oxide film layer 307 is formed. A gate oxide film 308 is formed by gate oxidation. A polysilicon film 309 is deposited by chemical vapor deposition (CVD) method using thermal decomposition of monosilane as shown in FIG. 10. Then, a silicon oxide film (SiO$_2$ film) 310 is formed on the polysilicon film 309 in the region where the gate conductor layers 4aa, 4ab, 4ba, and 4bb are defined. Then, the polysilicon film 309 other than the gate conductor layers 4aa, 4ab, 4ba, and 4bb is removed by etching using the SiO$_2$ film 310 or a resist film as a mask, whereby the gate conductor layers 4aa, 4ab, 4ba, and 4bb are formed as shown in FIG. 11. Then, the SiO$_2$ film 310 is removed and the polysilicon of the gate conductor layers 4aa, 4ab, 4ba, and 4bb is oxidized to form the insulating films 17aa, 17b, 17ba, and 17bb.

Figure 12:
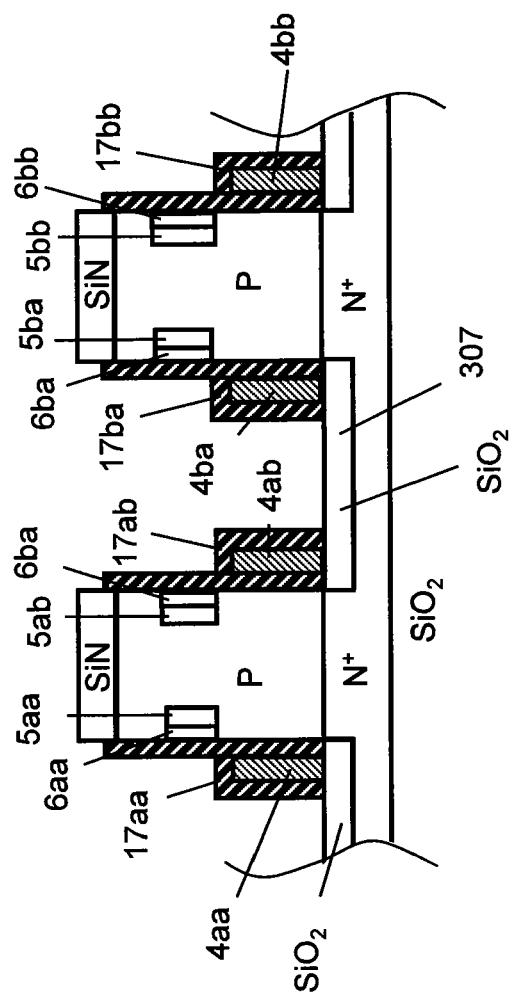
FIG. 12 is an illustration for explaining a method of producing the solid state imaging device according to Embodiment 4.
Figure 13:
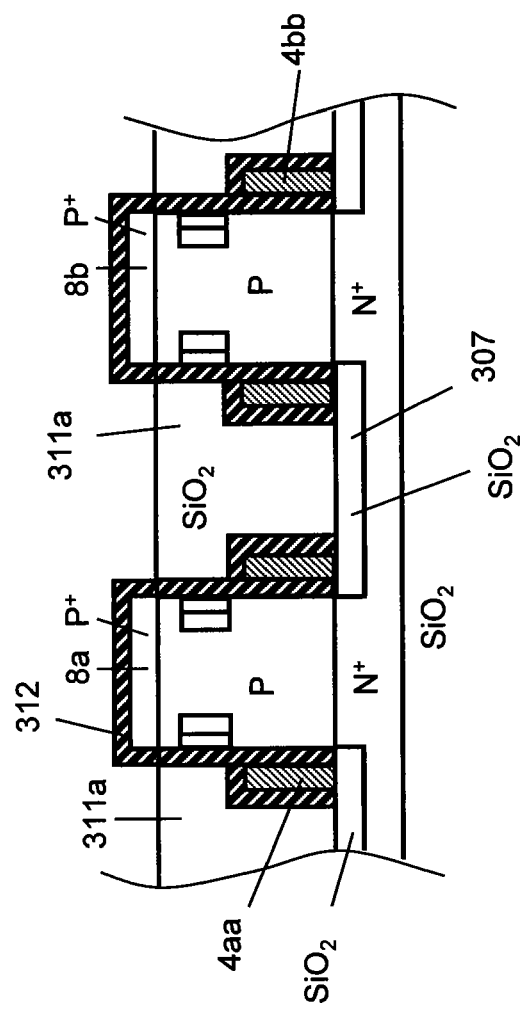
FIG. 13 is an illustration for explaining a method of producing the solid state imaging device according to Embodiment 4.
Figure 14:
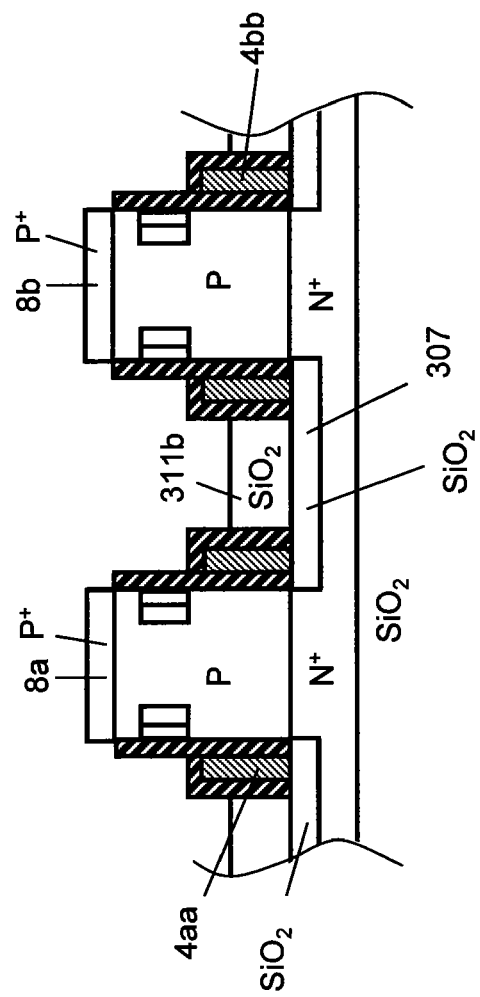
FIG. 14 is an illustration for explaining a method of producing the solid state imaging device according to Embodiment 4.
Figure 15:
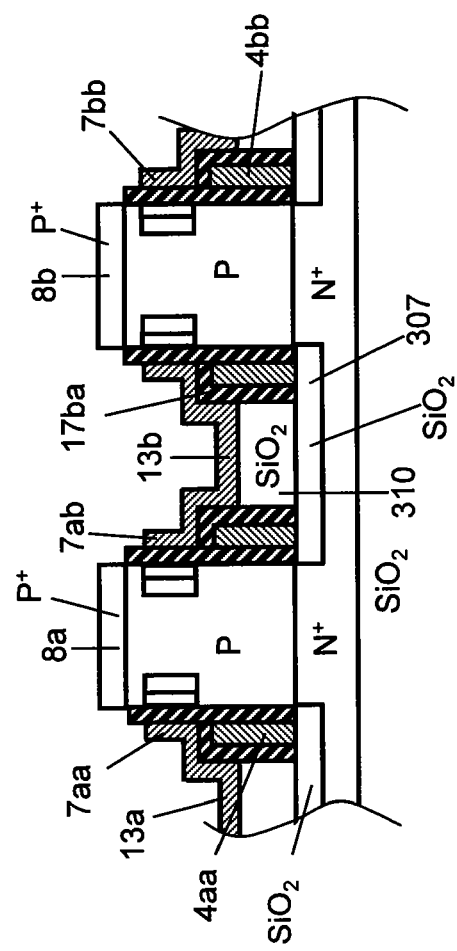
FIG. 15 is an illustration for explaining a method of producing the solid state imaging device according to Embodiment 4.

Then, phosphorus ions are implanted in the P-type silicon layer 301 by ion implantation to form the third semiconductor N layers 5aa, 5ab, 5ba, and 5bb. Boron ions are further implanted in the third semiconductor N layers 5aa, 5ab, 5ba, and 5bb by ion implantation to form the fourth semiconductor P$^+$ layers 6aa, 6ab, 6ba, and 6bb as shown in FIG. 12. Then, the silicon nitride film 302 is removed off. Then, silicon oxide or silicon nitride is deposited, flattened, and etched back to form a silicon oxide film 311a. The exposed semiconductor layer is oxidized to form a silicon oxide film 312. Boron is implanted to form the fifth semiconductor P$^+$ layers 8a and 8b as shown in FIG. 13. Then, the silicon oxide film 312 is removed off. The silicon oxide film 311a is removed by etching to the depth at which the conductor electrodes 7ab and 7ba and gate conductor layers 4ab and 4ba overlap with each other so as to form a silicon oxide film 311b as shown in FIG. 14. Then, the polysilicon of the gate conductor layers 4aa, 4ab, 4ba and 4bb is oxidized. Then, a metal film is formed on the entire surface of the resultant substrate by vacuum deposition or sputtering and patterned to form the conductor electrodes 7aa, 7ab, 7ba, and 7bb and the wiring conductor layers 13a to 13c connecting the conductor electrodes 7aa, 7ab, 7ba, and 7bb to each other as shown in FIG. 15.

With the above process, the pixel structure of the solid state imaging device 100c according to Embodiment 4 can be obtained.

Embodiment 5

Figure 16A:
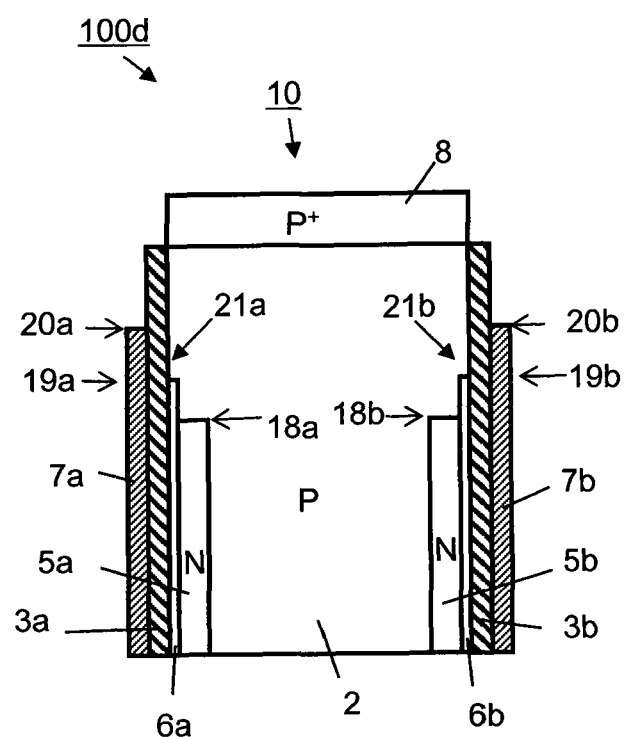
FIG. 16A is an enlarged view of a partial pixel structure of a solid state imaging device according to Embodiment 5 of the present invention.

A solid state imaging device 100d according to Embodiment 5 of the present invention will be described hereafter with reference to FIG. 16A. This figure is an enlarged view of a part of the pixel 10 shown in FIG. 1A.

The electrode top end 20a, 20b of the conductor electrode 7a, 7b, the P$^+$ layer top end 19a, 19b of the fourth semiconductor P$^+$ layer 6a, 6b, and the N layer top end 18a, 18b of the third semiconductor N layer 5a, 5b are increasing spaced from the fifth semiconductor P$^+$ layer 8 in this order in the direction from the fifth semiconductor P$^+$ layer 8 to the first semiconductor N$^+$ layer 1.

The potential of the surface region 21a, 21b of the second semiconductor P layer 2 between the electrode top end 20a, 20b of the conductor electrode 7a, 7b and the P$^+$ layer top end 19a, 19b of the fourth semiconductor P$^+$ layer 6a, 6b is controlled by the voltage applied to the conductor electrode 7a, 7b. In this way, the potential of the fourth semiconductor P$^+$ layer 6a, 6b is less affected by the potential of the fifth semiconductor P$^+$ layer 8 that changes during the imaging. Therefore, the potential of the fourth semiconductor P$^+$ layer 6a, 6b can stably be set by the voltage applied to the conductor electrode 7a, 7b.

The N layer top end 18a, 18b of the third semiconductor N layer 5a, 5b is farther away from the top surface of the second semiconductor P layer 2 than the P$^+$ layer top end 19a, 19b of the fourth semiconductor P$^+$ layer 6a, 6b. Therefore, the fourth semiconductor P$^+$ layer 6a, 6b is in contact with the second semiconductor P layer 2 in a larger area than that in the above embodiments. Then, holes 30 are supplied from the second semiconductor P layer 2 to the fourth semiconductor P$^+$ layer 6a, 6b in a stable manner. In this embodiment, since the signal charges accumulated in the photodiode consists of electrons, holes having the opposite polarity are supplied. Consequently, dark current can be prevented in a stable manner.

Figure 16B:
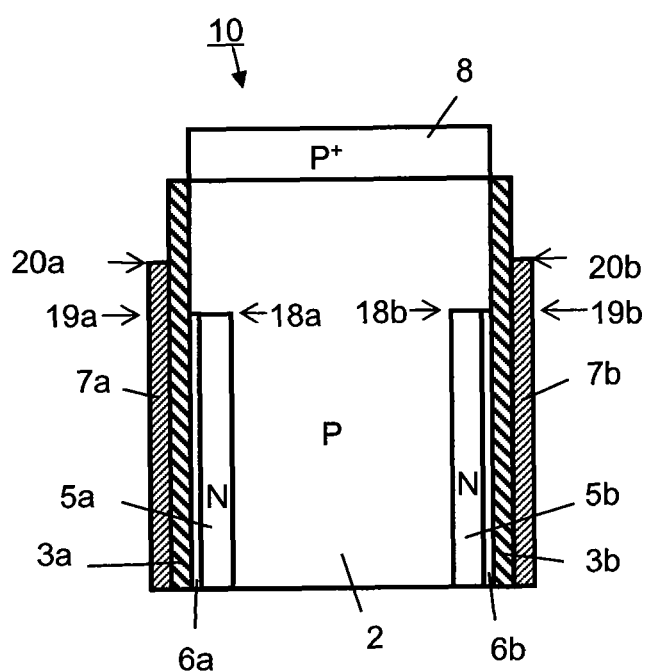
FIG. 16B is an enlarged view of a partial pixel structure of a solid state imaging device according to Embodiment 5 of the present invention.

Alternatively, as shown in FIG. 16B, the P$^+$ layer top end 19a, 19b of the fourth semiconductor P$^+$ layer 6a, 6b and the N layer top end 18a, 18b of the third semiconductor N layer 5a, 5b can be flush with each other. In such a structure, holes are supplied from the second semiconductor P layer 2 to the fourth semiconductor P$^+$ layer 6a, 6b and dark current can be prevented.

Embodiment 6

Figure 17A:
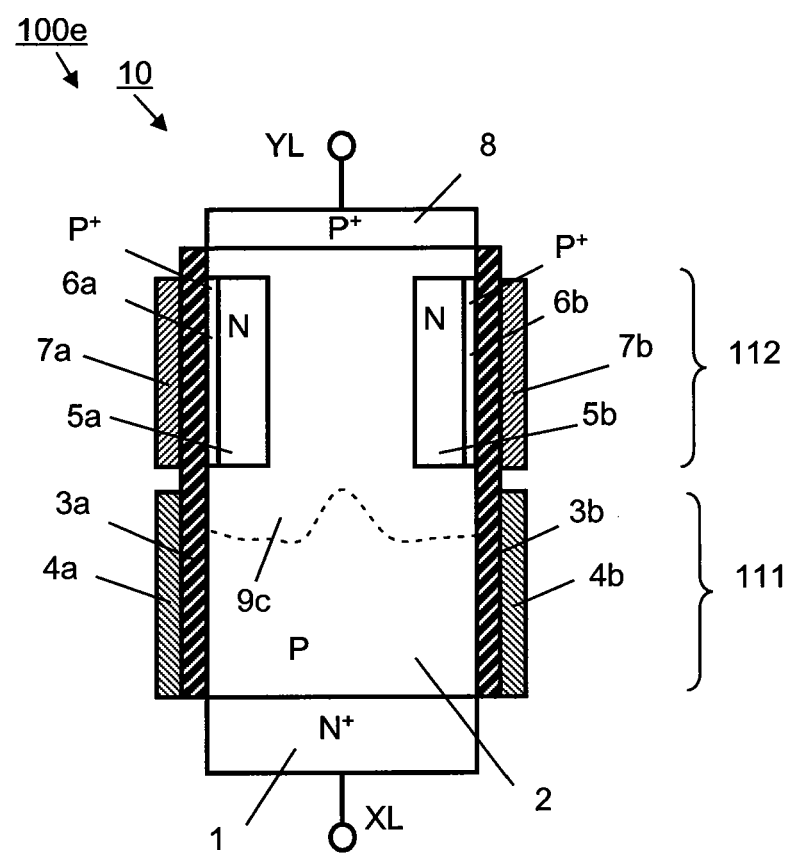
FIG. 17A is an illustration showing a pixel structure for explaining a solid state imaging device according to Embodiment 6 of the present invention.
Figure 17B:
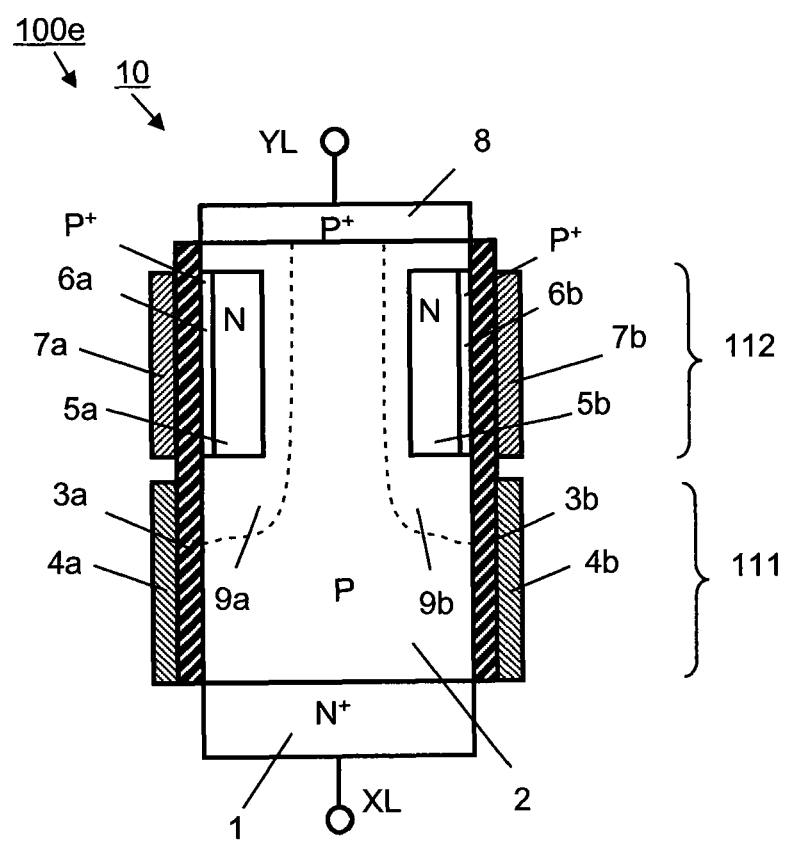
FIG. 17B is an illustration showing a pixel structure for explaining a solid state imaging device according to Embodiment 6 of the present invention.
Figure 17C:
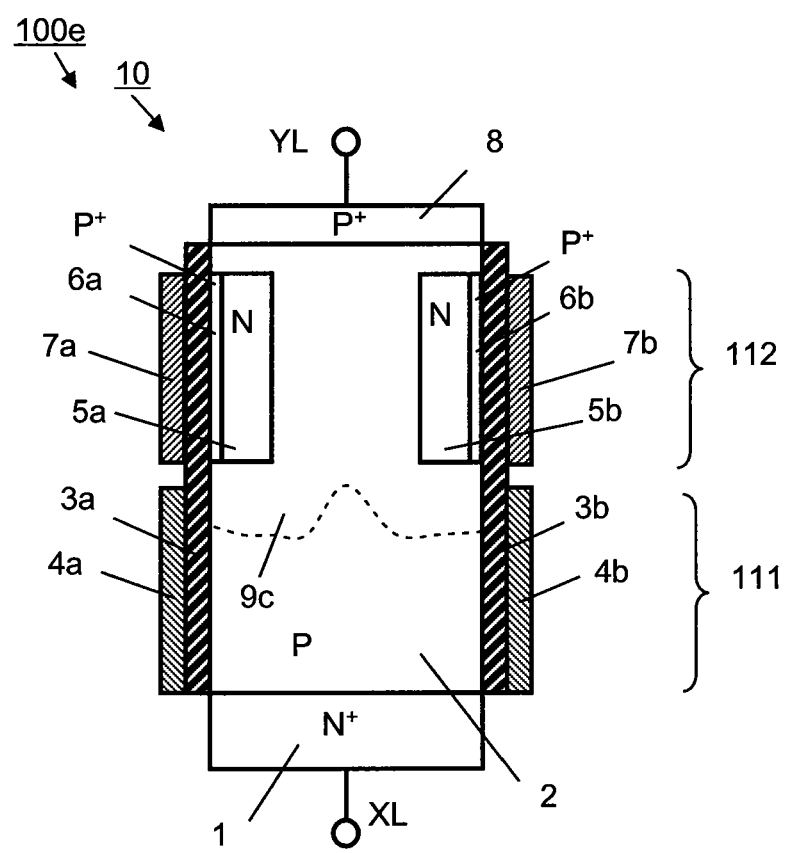
FIG. 17C is an illustration showing a pixel structure for explaining a solid state imaging device according to Embodiment 6 of the present invention.

FIGS. 17A to 17C show the structure of a pixel 10 for explaining a solid state imaging device 100e according to Embodiment 6 of the present invention. The same components as those of the solid state imaging device 100 according to Embodiment 1 are referred to by the same reference numbers.

As shown in FIG. 17A, the depleted layer 9c of the photodiode 112 occupies the upper region of the second semiconductor P layer 2 where the photodiode 112 is formed when no signal charge is accumulated in the photodiode 112 during the signal reading. The depleted layer 9c of the photodiode 112 in such a state can be formed by properly adjusting the thicknesses and impurity concentrations of the third semiconductor N layer 5a, 5b and the second semiconductor P layer 2 and further properly setting the voltage applied to the conductor electrode 7a, 7b on the photodiode 112.

No channel is formed for running a current between the fifth semiconductor $P^+$ layer 8 and the region of the second semiconductor P layer 2 which is adjacent to the first semiconductor $N^+$ layer 1 of the amplifying junction transistor when the depleted layer 9c occupies the upper region of the second semiconductor P layer 2.

When signal charges are accumulated in the photodiode 112, the width of the depleted layer 9a, 9b of the photodiode 112 is reduced during the signal reading as shown in FIG. 17B, whereby the channel of the amplifying junction channel is formed in the second semiconductor P layer 2 so that a current according to the accumulated signal charges runs through the channel.

FIG. 17C is an illustration showing the structure of a pixel including the depleted layer 9c when no signal is accumulated in the photodiode 112 during the signal charge accumulation. During the signal charge accumulation, for example, the voltage $V_{XLR}$ of the first semiconductor $N^+$ layer 1 is set to 0 V, the voltage $V_{YLR}$ of the fifth semiconductor $N^+$ layer 8 is set to 0 V, and the external voltage $V_{pg}$ is set to 0 V in a common practice.

As shown in FIG. 17C, the depleted layer 9c occupies the upper region of the second semiconductor P layer 2 when no signal charge is accumulated during the signal charge accumulation. The second semiconductor P layer 2 that is not occupied by the depleted layer 9c allows signal charges generated in the second semiconductor P layer 2 in the absence of the depleted layer 9c to diffuse to and reach the fifth semiconductor $P^+$ layer 8 or first semiconductor $N^+$ layer 1. Consequently, the signal charges generated in the second semiconductor P layer 2 are nullified in terms of signals. On the other hand, the depleted layer 9c occupying the upper region of the second semiconductor P layer 2 contributes to effective accumulation of signal charges in the photodiode 112. Particularly, signal charges generated upon irradiation of a small quantity of light can effectively be captured and accumulated in the photodiode 112.

Furthermore, the amplifying junction transistor channel is pinched off when no signal charge is accumulated during the signal charge accumulation. Therefore, the injection of holes into the second semiconductor P layer 2 from the fifth semiconductor $P^+$ layer 8, for example, as a result of noise leaping to the pixel selection line is prevented by the depleted layer 9.

As described above, during the signal reading and signal charge accumulation, the depleted layer 9c of the photodiode 112 occupies the upper region of the second semiconductor P layer 2 when no signal charge is accumulated in the photodiode 112, providing a solid state imaging device having an excellent low light performance.

In the above Embodiments 1 to 6, the explanation is made as to the case wherein the first semiconductor layer is an $N^+$ layer. The same effect can be obtained in a solid state imaging device in which the polarities of the semiconductor layers are reversed, i.e. the first semiconductor layer is a $P^+$ layer, the second semiconductor layer is an N layer, the third semiconductor layer is a P layer, the fourth semiconductor layer on the photodiode surface is an $N^+$ layer, and the fifth semiconductor layer is an $N^+$ layer. In such a case, holes are accumulated in the photodiode as signal charges. The voltage $V_{pg}$ of the conductor electrode is set so that electrons are accumulated in the surface region of the fourth semiconductor.

Furthermore, in the above Embodiments 1, 2, and 4 to 6, the wire joined to the first semiconductor $N^+$ layer 1 and the wire joined to the fifth semiconductor $P^+$ layer 8 are orthogonal to each other. They are not necessarily orthogonal to each other when the first semiconductor $N^+$ layer 1 is exclusively used as a drain for removing signal charges during the reset operation.

In the above Embodiments 1 to 6, the explanation is made with one or two pixels. Needless to say, multiple pixels can be arranged in one-dimensional or two-dimensional array.

In the above Embodiments 1 to 6, the pixels can be arranged in a linear or zigzag pattern in the case of one-dimensional array and arranged in a linear lattice or honeycomb pattern in the case of two-dimensional array although they are not restricted thereto.

In the solid state imaging device according to the present invention, at least the diode, fourth semiconductor $P^+$ layer 6a, 6b, and the fifth semiconductor $P^+$ layer 8 are formed in the shape of an island. This island-shaped semiconductor can be cylindrical, hexagonal, or in other shapes.

In the above Embodiments 2 to 4, the conductor electrodes 7aa, 1ab, 7ba, and 7bb, the conductor layers 13a to 13c, and the filling conductor layers 15a to 15c and 16a to 16c are distinguished in material. However, the same effect can be obtained even if they are made of the same material.

In the above Embodiments 1 to 6, the explanation is made as to solid state imaging devices generating signal charges in pixels upon light irradiation. Needless to say, the present invention can be applied to those generating signal charges in pixels upon irradiation of electromagnetic energy wave such as visible light, ultraviolet light, infrared light, X-ray, radioactive ray, and an electron beam.

In the above Embodiments 1 to 6, the second semiconductor P layer 2 serves as the channel of the MOS transistor. For example, an impurity can be implanted in a region of the second semiconductor P layer 2 by ion implantation to form a channel.

Furthermore, the first semiconductor layer 1 can be formed continuously over pixels or formed for each pixel. When the first semiconductor layer 1 is formed for each pixel, the first semiconductor layers 1 can be connected each other by another metal wiring. The first and second semiconductor layers 1 and 2 do not need to be in contact with (jointed to) each other at their entire surfaces and can be in contact in part. Furthermore, the first semiconductor layer 1 can partly be replaced with another semiconductor layer.

In the above Embodiments 1 to 6, the gate conductor layer 4a, 4b of the MOS transistor and the conductor electrode 7a, 7b are made of a single material. For example, they can consist of multiple layers such as metal layers and polycrystalline silicon layer.

In the solid state imaging devices according to above Embodiments 1 to 6, the voltage $V_{pg}$ applied to the conductor electrode 7a, 7b can be nearly the same voltage throughout the signal charge accumulation, the signal reading, and the reset or can be changed as long as holes are supplied from the second semiconductor P layer 2 to the fourth semiconductor $P^+$ layer 6a, 6b and accumulated in the fourth semiconductor $P^+$ layer 6a, 6b.

In the above Embodiments 1 to 6, the P+ layer top end 19a, 19b of the fourth semiconductor P+ layer 6a, 6b and the electrode top end 20a, 20b of the conductor electrode 7a, 7b are flush with each other or the P+ layer top end 19a, 19b is farther away from the fifth semiconductor layer 8 than the electrode top surface 20a, 20b. However, the electrode top surface 20a, 20b can be farther away from the fifth semiconductor P+ layer 8 than the P+ layer top end 19a, 19b if the fourth semiconductor P+ layer 6a, 6b and the fifth semiconductor P+ layer 8 are separated by the second P layer 2 and holes are supplied from the second semiconductor P layer 2 to the fourth semiconductor P+ layer 6a, 6b.

Having described and illustrated the principles of this application by reference to one (or more) preferred embodiment(s), it should be apparent that the preferred embodiment(s) may be modified in arrangement and detail without departing from the principles disclosed herein and that it is intended that the application be construed as including all such modifications and variations insofar as they come within the spirit and scope of the subject matter disclosed herein.

What is claimed is:

1. A solid state imaging device including one or more pixels, each of the pixels comprising:
   a first semiconductor layer formed on a substrate;
   a second semiconductor layer formed on the first semiconductor layer;
   a fourth semiconductor layer formed in a lateral side of an upper region of the second semiconductor layer away from a top surface of the second semiconductor layer;
   a third semiconductor layer formed between an inner side of the fourth semiconductor layer and the second semiconductor layer away from the top surface of the second semiconductor layer;
   a first insulating film formed at least on a side of the second semiconductor layer and on an outer side of the fourth semiconductor layer;
   a gate conductor layer formed on a side of a lower region of the second semiconductor layer via the first insulating film, the third semiconductor layer being not formed in the lower region of the second semiconductor layer;
   a conductor electrode formed on an outer side of the fourth semiconductor layer via the first insulating film; and
   a fifth semiconductor layer formed on the top surface of the second semiconductor layer so as not to be in contact with the third semiconductor layer and the fourth semiconductor layer,
   wherein
   at least the third semiconductor layer, the upper region of the second semiconductor layer where the third semiconductor layer is formed, the fourth semiconductor layer, and the fifth semiconductor layer are formed in a shape of an island,
   a diode comprises the third semiconductor layer and a region of the second semiconductor layer which is adjacent to the third semiconductor layer,
   a junction transistor comprises: one of the fifth semiconductor layer and the region of the second semiconductor layer which is adjacent to the first semiconductor layer serving as a drain of the junction transistor; the other of the fifth semiconductor layer and the region of the second semiconductor layer which is adjacent to the first semiconductor layer serving as a source of the junction transistor; and the diode serving as a gate of the junction transistor; and
   a field effect transistor comprises: the first semiconductor layer serving as a drain of the field effect transistor; the third semiconductor layer serving as a source of the field effect transistor; and the gate conductor layer serving as a gate of the field effect transistor, and
   the solid state imaging device further comprising:
   means for accumulating a signal charge in the diode, the signal charge generated in the pixel by irradiation of electromagnetic energy wave;
   signal reading means for measuring a current running through the junction transistor so as to measure a quantity of the signal charge accumulated in the diode, the current being changed according to the quantity of the signal charge accumulated in the diode; and
   reset means for applying an ON voltage to the gate conductor layer of the field effect transistor to create a channel in a region including a region of the second semiconductor layer which is between the first semiconductor layer and the third semiconductor layer, whereby the signal charge accumulated in the diode is transferred to the first semiconductor layer and removed,
   a voltage is applied to the conductor electrode so that a charge having a polarity opposite to a polarity of the signal charge accumulated in the diode is accumulated in the fourth semiconductor layer.

2. The solid state imaging device according to claim 1 wherein,
   the second semiconductor layer has a conductivity type opposite to a conductivity type of the first semiconductor layer or a substantially intrinsic type,
   the third semiconductor layer has a same conductivity type as the conductivity type of the first semiconductor layer,
   the fourth semiconductor layer has a conductivity type opposite to the conductivity type of the first semiconductor layer, and
   the fifth semiconductor layer has a conductivity type opposite to the conductivity type of the first semiconductor layer.

3. The solid state imaging device according to claim 1, further comprising a wiring conductor layer connecting the conductor electrodes of adjacent pixels near the gate conductor layer, the wiring conductor layer formed by a light-blocking conductive material.

4. The solid state imaging device according to claim 3, wherein
   the wiring conductor layer connects substantially all of the conductor electrodes of the multiple pixels.

5. The solid state imaging device according to claim 1, further comprising a second insulating film covering the gate conductor layer,
   wherein the conductor electrode overlaps with at least part of the gate conductor layer via the second insulating film.

6. The solid state imaging device according to claim 1, further comprising a filling conductor layer filling between the conductor electrodes of adjacent pixels, between the gate conductor layers of adjacent pixels, or between the conductor electrodes of adjacent pixels and between the gate conductor layers of adjacent pixels, the filling conductor layer including a light-blocking conductive material.

7. The solid state imaging device according to claim 1, wherein
   the third semiconductor layer, the fourth semiconductor layer, and the conductor electrode are formed so that a top end of the third semiconductor layer, a top end of the fourth semiconductor layer, and a top end of the conductor electrode are nearly flush with each other in a direction from the fifth semiconductor layer to the first semiconductor layer, or the third semiconductor layer, the fourth semiconductor layer, and the conductor electrode are formed so that a top end of the third semiconductor layer is farther away from the fifth semiconductor layer than a top end of the conductor electrode, and a top end of the fourth semiconductor layer is positioned between the top end of the third semiconductor layer and the top end of the conductor electrode in a direction from the fifth semiconductor layer to the first semiconductor layer.

8. The solid state imaging device according to claim 1, wherein
the reset means apply a voltage to the conductor electrode so that potentials become deeper in a following order: the potential of the fifth semiconductor layer; the deepest potential in the third semiconductor layer when no signal charge is accumulated in the diode; the potential of the channel of the second semiconductor layer when an ON voltage is applied to the gate conductor layer of the field effect transistor; and the potential of the first semiconductor layer.

9. The solid state imaging device according to claim 1, wherein
the signal reading means apply a voltage to the conductor electrode so that a depleted layer of the diode occupies substantially the entire upper region of the second semiconductor layer when no signal charge is accumulated in the diode.

* * * * *